(12) United States Patent
Jang et al.

(10) Patent No.: US 12,446,444 B2
(45) Date of Patent: Oct. 14, 2025

(54) DISPLAY APPARATUS AND ELECTRONIC APPARATUS INCLUDING THE SAME

(71) Applicant: Samsung Display Co., Ltd., Yongin-si (KR)

(72) Inventors: Kyeongwoo Jang, Yongin-si (KR); Sungho Kim, Yongin-si (KR); Kiho Bang, Yongin-si (KR); Jinsung An, Yongin-si (KR); Minwoo Woo, Yongin-si (KR); Wangwoo Lee, Yongin-si (KR); Changho Yi, Yongin-si (KR); Hyeri Cho, Yongin-si (KR); Seunghyun Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 412 days.

(21) Appl. No.: 18/116,433

(22) Filed: Mar. 2, 2023

(65) Prior Publication Data

US 2023/0389397 A1    Nov. 30, 2023

(30) Foreign Application Priority Data

May 30, 2022    (KR) ................... 10-2022-0066348

(51) Int. Cl.
*H10K 59/80*    (2023.01)
*H04M 1/02*    (2006.01)
*H10K 59/131*    (2023.01)

(52) U.S. Cl.
CPC ........ *H10K 59/873* (2023.02); *H04M 1/0266* (2013.01); *H10K 59/131* (2023.02)

(58) Field of Classification Search
CPC .. H10K 59/873; H10K 59/131; H10K 59/123; H10K 59/124; H10K 59/12; H10K 59/8731; H10K 50/844; H10K 50/8426; H10K 59/35; H04M 1/0266
See application file for complete search history.

(56) References Cited

U.S. PATENT DOCUMENTS

| 9,553,156 | B2 | 1/2017 | Kim et al. |
| 9,716,248 | B2* | 7/2017 | Visweswaran ..... H10K 59/8051 |
| 2020/0212159 | A1* | 7/2020 | Lee ...................... H10K 59/121 |
| 2021/0202652 | A1 | 7/2021 | Kim et al. |

FOREIGN PATENT DOCUMENTS

| KR | 10-2204785 | 2/2016 |
| KR | 10-2230692 | 3/2021 |
| KR | 10-2021-0086792 | 7/2021 |

* cited by examiner

*Primary Examiner* — Karen Kusumakar

(57) ABSTRACT

A display apparatus includes a display area and a non-display area, an inorganic insulating layer, display elements in the display area, an encapsulation layer including a first inorganic encapsulation layer, a second inorganic encapsulation layer, and an organic encapsulation layer between the first inorganic encapsulation layer and the second inorganic encapsulation layer, a dam in the non-display area, and a power supply line on the inorganic insulating layer in the non-display area, and a portion of the power supply line intersects the dam, an edge of the portion of the power supply line is covered by at least one transparent conductive material layer, a portion of the first inorganic encapsulation layer is on the portion of the power supply line covered by the at least one transparent conductive material layer.

23 Claims, 14 Drawing Sheets

DISPLAY APPARATUS AND ELECTRONIC APPARATUS INCLUDING THE SAME

CROSS-REFERENCE TO RELATED APPLICATION(S)

This application claims priority to and benefits of Korean Patent Application No. 10-2022-0066348 under 35 U.S.C. § 119, filed on May 30, 2022, in the Korean Intellectual Property Office, the entire contents of which are incorporated by reference herein in its entirety.

BACKGROUND

1. Technical Field

One or more embodiments relate to a display apparatus and an electronic apparatus including the same.

2. Description of the Related Art

Recently, the usage of display apparatuses has diversified. As display apparatuses have become thinner and lighter, their range of use has gradually been extended.

Among display apparatuses, an organic light-emitting display apparatus has advantages of a wide viewing angle, high contrast, and fast response speed, and thus, organic light-emitting display apparatuses are in the limelight as next-generation display apparatuses.

Generally, an organic light-emitting display apparatus may include a thin-film transistor and an organic light-emitting diode as a display element over a substrate, and operates while the organic light-emitting diode emits light spontaneously. The organic light-emitting display apparatus is used as a display unit of miniaturized products such as mobile phones, and used as a display unit of large-scale products such as televisions.

However, a display element acting as a light-emitting element in a display apparatus according to the related art is vulnerable to external moisture transmission.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display apparatus with a structure strong against moisture transmission in the outside of a display area, and with an improved reliability.

Additional aspects will be set forth in part in the description which follows and, in part, will be apparent from the description, or may be learned by practice of the embodiments of the disclosure.

According to one or more embodiments, a display apparatus may include a display area and a non-display area adjacent to the display area; an inorganic insulating layer disposed in the display area and the non-display area; display elements disposed in the display area; a thin-film encapsulation layer disposed on the display elements and including a first inorganic encapsulation layer; a second inorganic encapsulation layer; and an organic encapsulation layer disposed between the first inorganic encapsulation layer and the second inorganic encapsulation layer; a dam disposed in the non-display area and surrounding the display area; and a power supply line disposed on the inorganic insulating layer in the non-display area, wherein a portion of the power supply line intersects the dam, an edge of the portion of the power supply line is covered by at least one transparent conductive material layer, the first inorganic encapsulation layer extends to the non-display area, and a portion of the first inorganic encapsulation layer is disposed on the portion of the power supply line covered by the at least one transparent conductive material layer.

The edge of the portion of the power supply line may be covered by the at least one transparent conductive material layer, between the dam and an edge of a substrate.

The power supply line may have a triple-layered structure including a first layer; a third layer; and a second layer, wherein the first layer and the third layer may include a same material, and the second layer may be disposed between the first layer and the third layer.

The first layer and the third layer of the power supply line may each include titanium, and the second layer may include aluminum.

The display area may include a first display area and a second display area at least partially surrounded by the first display area, the display apparatus may further comprise first display elements disposed in the first display area; second display elements disposed in the second display area; second sub-pixel circuits respectively electrically connected to the second display elements; and connection lines respectively electrically connecting the second display elements to the second sub-pixel circuits, and the second sub-pixel circuits may be disposed between the first display area and the second display area, or in the non-display area.

The connection lines may include a first connection line; a second connection line; and a third connection line respectively disposed on different layers, and the at least one transparent conductive material layer may include a first transparent conductive material layer; a second transparent conductive material layer; and a third transparent conductive material layer, the second transparent conductive material layer disposed on the first transparent conductive material layer, and the third transparent conductive material layer disposed on the second transparent conductive material layer.

The first connection line and the first transparent conductive material layer may include a same material, the second connection line and the second transparent conductive material layer may include a same material, and the third connection line and the third transparent conductive material layer may include a same material.

The edge of the portion of the power supply line may have a substantially straight line shape in plan view.

The at least one transparent conductive material layer may continuously cover an upper surface of the portion of the power supply line, a lateral surface corresponding to the edge of the portion of the power supply line, and an upper surface of the inorganic insulating layer disposed below the portion of the power supply line.

The at least one transparent conductive material layer may directly contact the upper surface of the portion of the power supply line, the lateral surface corresponding to the edge of the portion of the power supply line, and the upper surface of the inorganic insulating layer disposed below the portion of the power supply line.

According to one or more embodiments, a display apparatus may include a display area, the display area may include a first display area; and a second display area at least partially surrounded by the first display area; a non-display area adjacent to the display area; an inorganic insulating layer disposed in the display area and the non-display area; first display elements disposed in the first display area; second display elements disposed in the second display area; second sub-pixel circuits disposed between the first display area and the second display area, or in the non-display area, and respectively electrically connected to the second display elements; connection lines respectively electrically connecting the second display elements to the second sub-pixel circuits; a thin-film encapsulation layer disposed on the first display elements and the second display elements, and including a first inorganic encapsulation layer; a second inorganic encapsulation layer; and an organic encapsulation layer disposed between the first inorganic encapsulation layer and the second inorganic encapsulation layer; a dam disposed in the non-display area and surrounding the display area; and a power supply line disposed on the inorganic insulating layer in the non-display area, wherein a portion of the power supply line intersects the dam, an edge of the portion of the power supply line is covered by at least one transparent conductive material layer, the first inorganic encapsulation layer extends to the non-display area, and a portion of the first inorganic encapsulation layer is disposed on the portion of the power supply line covered by the at least one transparent conductive material layer.

The at least one transparent conductive material layer may include a first transparent conductive material layer; a second transparent conductive material layer; and a third transparent conductive material layer, the second transparent conductive material layer disposed on the first transparent conductive material layer, and the third transparent conductive material layer disposed on the second transparent conductive material layer.

The connection lines may include a first connection line, a second connection line, and a third connection line respectively disposed on different layers.

The first connection line and the first transparent conductive material layer may include a same material, the second connection line and the second transparent conductive material layer may include a same material, and the third connection line and the third transparent conductive material layer may include a same material.

The edge of the portion of the power supply line may be covered by the at least one transparent conductive material layer, between the dam and an edge of a substrate.

The at least one transparent conductive material layer may continuously cover an upper surface of the portion of the power supply line, a lateral surface corresponding to the edge of the portion of the power supply line, and an upper surface of the inorganic insulating layer disposed below the portion of the power supply line.

The edge of the portion of the power supply line may have a substantially straight line shape in plan view.

According to one or more embodiments, an electronic apparatus may include a display apparatus including a display area the display area may include a first display area; and a second display area at least partially surrounded by the first display area; and a non-display area adjacent to the display area; and a component disposed below the display apparatus and corresponding to the second display area, wherein the display apparatus may include an inorganic insulating layer disposed in the display area and the non-display area; display elements disposed in the display area; a thin-film encapsulation layer disposed on the display elements and including a first inorganic encapsulation layer; and a second inorganic encapsulation layer; and an organic encapsulation layer disposed between the first inorganic encapsulation layer and the second inorganic encapsulation layer; a dam disposed in the non-display area and surrounding the display area; and a power supply line disposed on the inorganic insulating layer in the non-display area, wherein a portion of the power supply line intersects the dam, an edge of the portion of the power supply line is covered by at least one transparent conductive material layer, the first inorganic encapsulation layer extends to the non-display area, and a portion of the first inorganic encapsulation layer is disposed on the portion of the power supply line covered by the at least one transparent conductive material layer.

The edge of the portion of the power supply line may be covered by the at least one transparent conductive material layer, between the dam and an edge of the substrate.

The display apparatus may include first display elements arranged in the first display area, second display elements disposed in the second display area, second sub-pixel circuits respectively electrically connected to the second display elements, and connection lines respectively electrically connecting the second display elements to the second sub-pixel circuits, wherein the second sub-pixel circuits may be disposed between the first display area and the second display area, or in the non-display area.

The connection lines may include a first connection line, a second connection line, and a third connection line respectively disposed on different layers, and the at least one transparent conductive material layer may include a first transparent conductive material layer; a second transparent conductive material layer; and a third transparent conductive material layer, the second transparent conductive material layer disposed on the first transparent conductive material layer, and the third transparent conductive material layer disposed on the second transparent conductive material layer.

The first connection line and the first transparent conductive material layer may include a same material, the second connection line and the second transparent conductive material layer may include a same material, and the third connection line and the third transparent conductive material layer may include a same material.

The edge of the portion of the power supply line may have a substantially straight line shape in plan view.

These and/or other aspects will become apparent and more readily appreciated from the following description of the embodiments, the accompanying drawings, and claims.

BRIEF DESCRIPTION OF THE DRAWINGS

The above and other aspects, features, and advantages of embodiments will be more apparent from the following description taken in conjunction with the accompanying drawings, in which.

DETAILED DESCRIPTION OF THE EMBODIMENTS

Figure 1A:
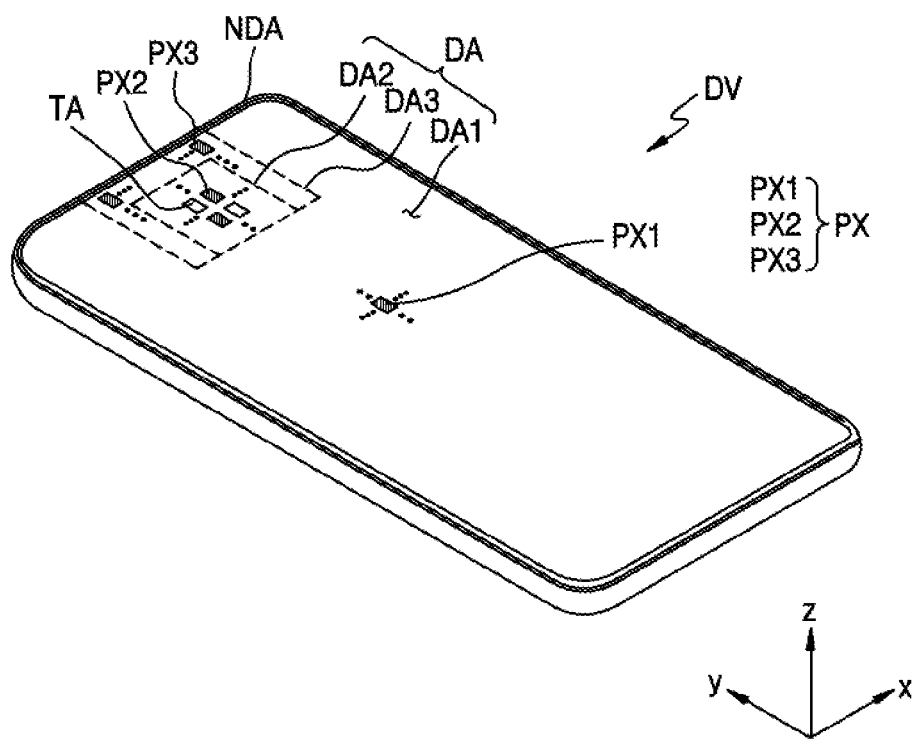
FIGS. 1A and 1B are schematic perspective views of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are described below, by referring to the figures, to explain aspects of the description.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The singular forms "a," "an," and "the" as used herein are intended to include the plural forms as well unless the context clearly indicates otherwise.

It will be understood that the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

It will be further understood that, when a layer, region, or component is referred to as being "on" another layer, region, or component, it can be directly or indirectly on the other layer, region, or component. For example, intervening layers, regions, or components may be present.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

Sizes of elements in the drawings may be exaggerated or reduced for convenience of explanation. As an example, the size and thickness of each element shown in the drawings are arbitrarily represented for convenience of description, and thus, the disclosure is not necessarily limited thereto.

In the specification, "A and/or B" means A or B, or A and B. In the specification, "at least one of A and B" means A or B, or A and B.

As used herein, when a wiring is referred to as "extending in a first direction or a second direction," it means that the wiring not only extends in a straight line shape but also extends in a zigzag or in a curve in the first direction or the second direction.

As used herein, "on plan view" means that an objective portion is viewed from above, and "on a cross-sectional view" means that a cross-section of an objective portion taken vertically is viewed from a lateral side. As used herein, "overlapping" also includes overlapping "in plan view" and "in a cross-sectional view."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure are described in detail with reference to the accompanying drawings.

When description is made with reference to the drawings, like reference numerals are used for like or corresponding elements.

Figure 1B:
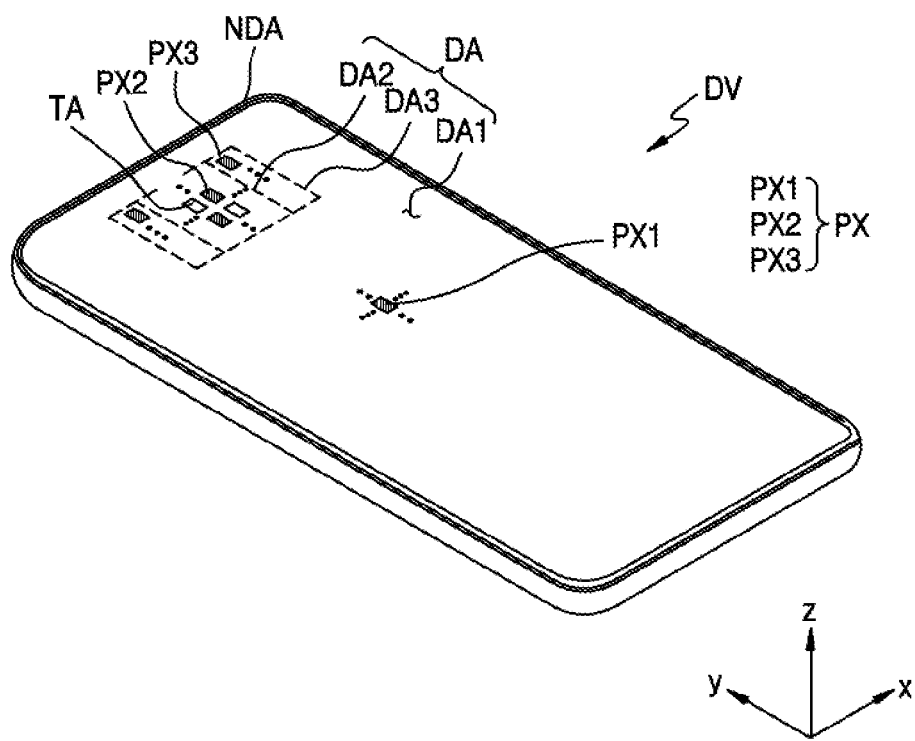

FIGS. 1A and 1B are schematic perspective views of a display apparatus DV according to an embodiment.

The display apparatus DV may display images. The display apparatus DV may include sub-pixels PX. The sub-pixel PX may be defined as a region through which a display element emits light. The sub-pixel PX may be provided in plurality in the display apparatus DV. The sub-pixels PX may each emit light, for example, red, green, blue, or white light. Each sub-pixel PX may be, for example, a red, green, or blue sub-pixel. In an embodiment, the display apparatus DV may include a first sub-pixel PX1, a second sub-pixel PX2, and a third sub-pixel PX3.

The display apparatus DV may include a display area DA and a non-display area NDA outside the display area DA. The display area DA may include a first display area DA1, a second display area DA2, and a third display area DA3. The sub-pixels PX may be arranged or disposed in the first display area DA1, the second display area DA2, and the third display area DA3. The sub-pixels PX may not be arranged in the non-display area NDA.

The first display area DA1 may at least partially surround the second display area DA2 and the third display area DA3. In an embodiment, the first display area DA1 may surround only a portion of the second display area DA2 and the third display area DA3. In an embodiment, the first display area DA1 may surround the second display area DA2 and the third display area DA3 entirely. The first display area DA1 may include the first sub-pixel PX1. The first sub-pixel PX1 may be provided in plural in the first display area DA1.

At least one of the second display area DA2 and the third display area DA3 may be a region overlapping a component. As an example, as described below with reference to FIG. 2A, a component COM (see FIG. 2A), which is an electronic element, may be arranged below the display apparatus DV to correspond to the second display area DA2. At least one of the second display area DA2 and the third display area DA3 may include a transmissive area TA through which light and/or sound and the like output from the component COM to the outside, or progressing toward the component COM from the outside, may pass.

At least one of the second display area DA2 and the third display area DA3 may be a region overlapping the component COM and simultaneously a region in which the sub-pixels PX are arranged. As an example, the second display area DA2 may be a region overlapping the component and simultaneously a region in which the sub-pixels PX are arranged. In an embodiment, the second display area DA2 and the third display area DA3 may be regions overlapping the component and simultaneously regions in which the sub-pixels PX are arranged. In an embodiment, the second sub-pixel PX2 may be arranged in the second display area DA2. The second sub-pixel PX2 may be provided in plurality in the second display area DA2. The third sub-pixel PX3 may be arranged in the third display area DA3. The third sub-pixel PX3 may be provided in plurality in the third display area DA3.

In an embodiment, the resolution of an image displayed in at least one of the second display area DA2 and the third display area DA3, may be less than the resolution of an image displayed in the first display area DA1. As an example, the resolution of the second display area DA2 may be about ½, ⅜, ⅓, ¼, ⅖, ⅛, ⅑, 1/16, or the like of the resolution of the first display area DA1. As an example, the resolution of the first display area DA1 may be 400 ppi or more, and the resolution of the second display area DA2 may be about 200 ppi or about 100 ppi. In an embodiment, the resolution of one of the second display area DA2 and the third display area DA3 may be the same as the resolution of the first display area DA1.

At least one of the second display area DA2 and the third display area DA3 may overlap the component and include the transmissive area TA. In the case where the sub-pixels PX are not arranged in the transmissive area TA, the number of sub-pixels PX per unit area in at least one of the second display area DA2 and the third display area DA3, may be less than the number of sub-pixels PX per unit area in the first display area DA1. As an example, the number of second sub-pixels PX2 that may be arranged per unit area in the second display area DA2, may be less than the number of first sub-pixels PX1 arranged per unit area in the first display area DA1.

At least one of the second display area DA2 and the third display area DA3, may have a high transmittance with respect to light or sound. As an example, a transmittance of the display apparatus DV in at least one of the second display area DA2 and the third display area DA3, may be about 10% or more, for example 40% or more, about 25% or more, about 50% or more, about 85% or more, or about 90% or more.

At least one second display area DA2 may be provided in the display area DV. As an example, the display apparatus DV may include one second display area DA2, or second display areas DA2.

The third display area DA3 may be adjacent to the second display area DA2. The third display area DA3 may be arranged on one side or a side of the second display area DA2. As an example, the second display area DA2 and the third display area DA3 may be arranged side by side in a first direction (for example, an x direction or a −x direction). As another example, the second display area DA2 and the third display area DA3 may be arranged side by side in a second direction (for example, a y direction or a −y direction). In an embodiment, the third display area DA3 may be arranged on two opposite sides of the second display area DA2. In an embodiment, the third display area DA3 may be omitted. The display apparatus DV may also include a third direction, for example, a z direction or a −z direction.

Though it is shown in FIGS. 1A and 1B that the second display area DA2 and the third display area DA3 are arranged on the upper center of the display apparatus DV, the second display area DA2 and the third display area DA3 may be arranged on the lower side, right side, or left side of the display apparatus DV.

In an embodiment, at least one of the second display area DA2 and the third display area DA3 may have various shapes such as a circular shape, an elliptical shape, a polygon including a quadrangle, a star shape, a diamond shape, or the like in plan view (for example, an x-y plane). In an embodiment, it is shown in FIGS. 1A and 1B that the second display area DA2 and the third display area DA3 each have a quadrangular shape.

The non-display area NDA may surround at least a portion of the first display area DA1. In an embodiment, the non-display area NDA may surround the first display area DA1 entirely. In an embodiment, the non-display area NDA may surround the first display area DA1, the second display area DA2, and the third display area DA3 entirely.

The display apparatus DV of FIGS. 1A and 1B may be used in the following electronic apparatus. As an example, the display apparatus DV according to an embodiment may be used in portable electronic apparatuses such as mobile phones, smart phones, tablet personal computers, mobile communication terminals, electronic organizers, electronic books, portable multimedia players (PMP), navigations, and the like ultra mobile personal computers (UMPC), and the like within the spirit and the scope of the disclosure. The display apparatus DV according to an embodiment may be used in wearable electronic apparatuses including smartwatches, watchphones, glasses-type displays, and head-mounted displays (HMD). The display apparatus DV according to an embodiment may be used as instrument panels for automobiles, center fascias for automobiles, or center information displays (CID) arranged on a dashboard, room mirror displays that replace side mirrors of automobiles, and displays arranged on the backside of front seats as an entertainment for back seats of automobiles.

Figure 2A:
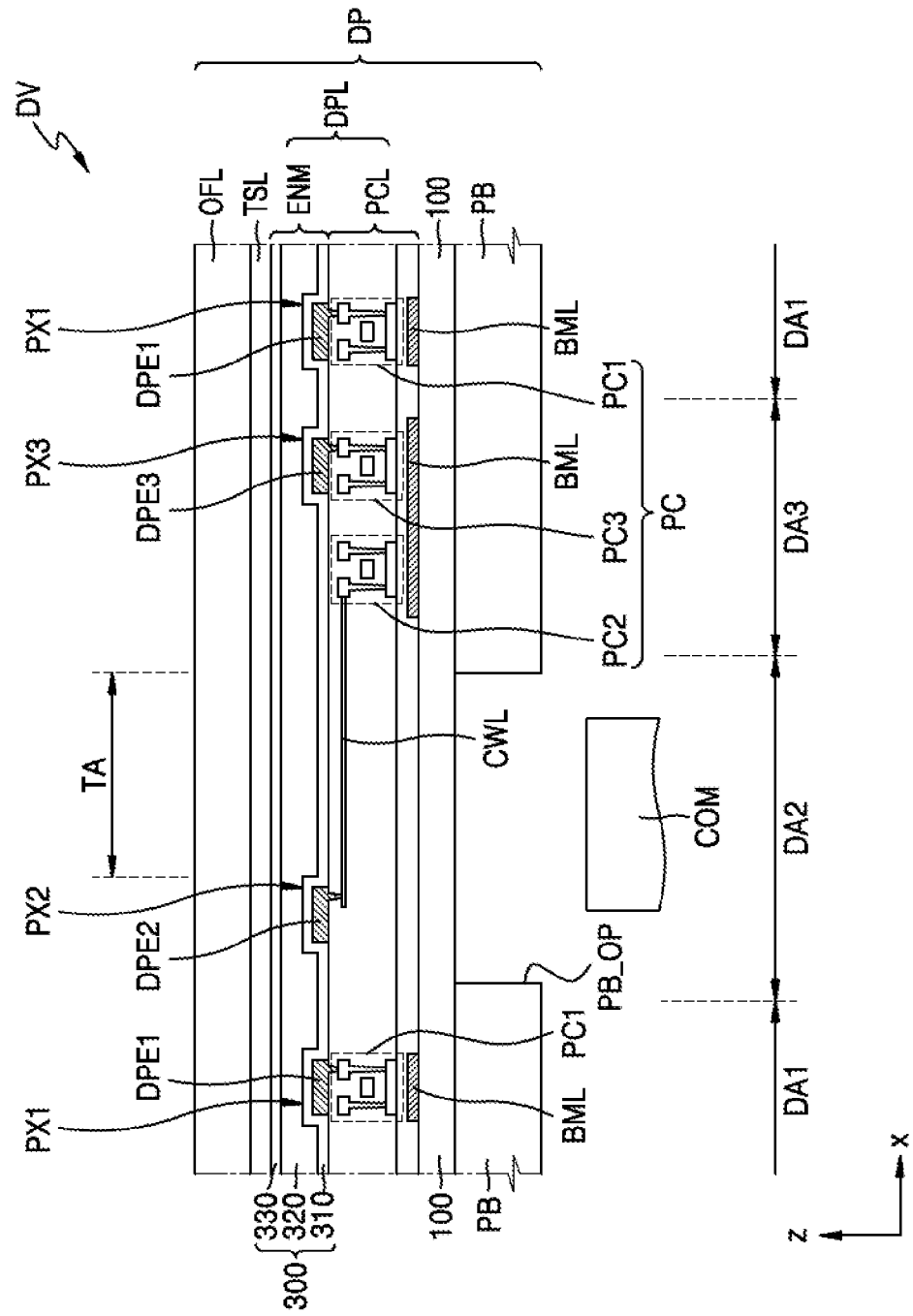
FIGS. 2A and 2B are schematic cross-sectional views of a portion of an electronic apparatus according to an embodiment.
Figure 2B:
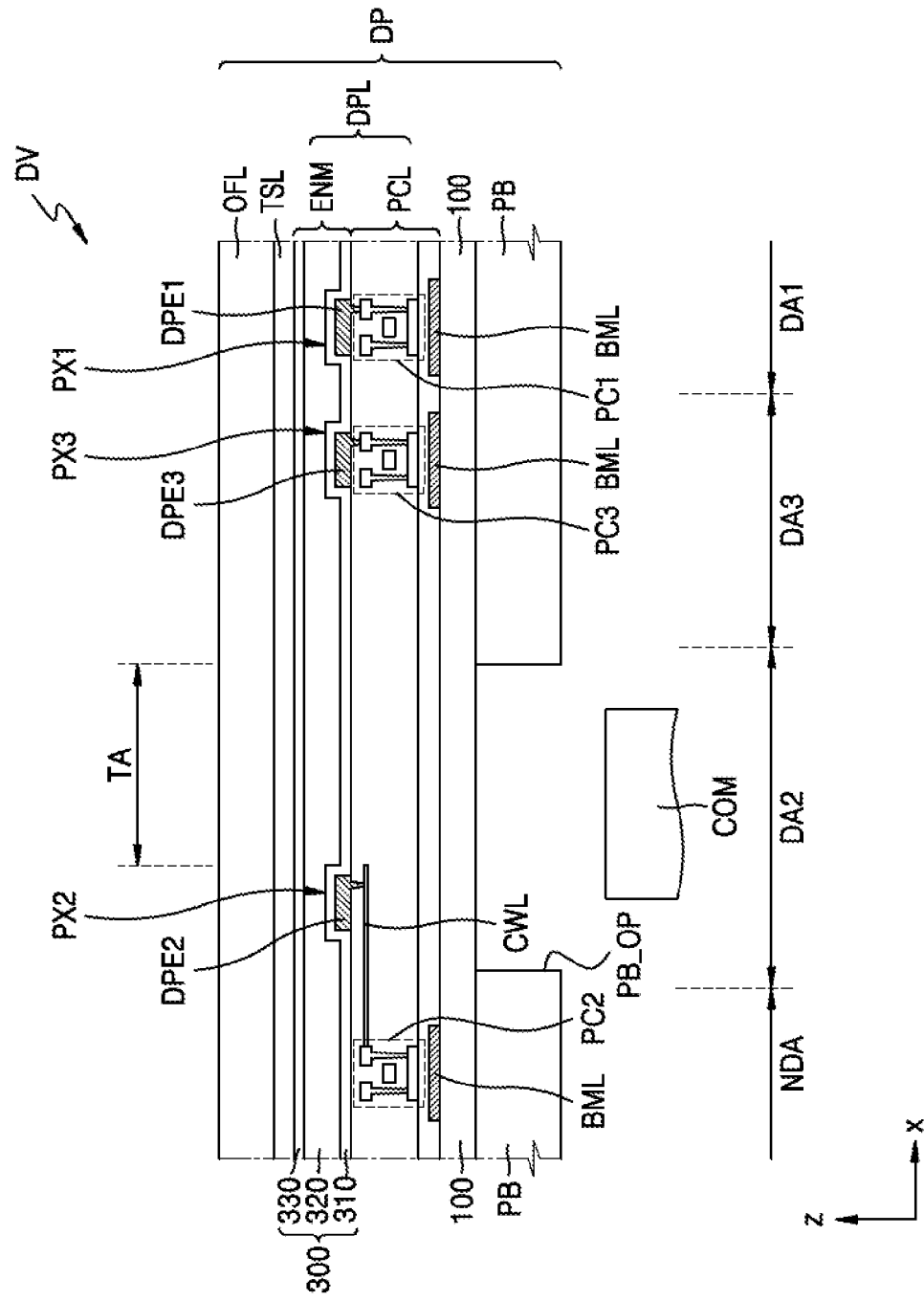

FIGS. 2A and 2B are schematic cross-sectional views of the electronic apparatus according to an embodiment.

Referring to FIGS. 2A and 2B, the electronic apparatus may include the display apparatus DV and a component COM overlapping the display apparatus DV. The electronic apparatus may further include a housing (not shown) and a cover window (not shown), wherein the housing receives the display apparatus DV, and the cover window is disposed on the display apparatus DV and protects the display apparatus DV.

The display apparatus DV may include a display panel DP. The display apparatus DV may further include an input sensor (not shown) and a driving circuit (not shown), wherein the input sensor senses an external input. The display panel DP may include a substrate 100, a display layer DPL, a touchscreen layer TSL, an optical functional layer OFL, and a panel protection member PB, the display layer DPL, the touchscreen layer TSL, and the optical functional layer OFL being on the substrate 100, and the panel protection member PB being under or below the substrate 100.

The component COM may be an electronic element that uses light or sound. As an example, the electronic element may be a sensor that measures a distance such as a proximity sensor, a sensor that recognizes a portion of a user's body (for example, a fingerprint, an iris, a face and the like), a small lamp that outputs light, or an image sensor (for example, a camera) that captures images. The electronic element that uses light may use light in various wavelength bands such as visible light, infrared light, ultraviolet light and the like within the spirit and the scope of the disclosure. The electronic element that uses sound may use ultrasonic waves or sound in different frequency bands. In an embodiment, the component COM may include sub-components such as a light-emitter and a light-receiver. The light-emitter and the light-receiver may have a structure integrated in one body, or a pair of the light-emitter and the light-receiver that are physically separated may constitute one component COM.

The display panel DP may include the first display area DA1, the second display area DA2, and the third display area DA3. In other words, the first display area DA1, the second display area DA2, and the third display area DA3 may be defined in the substrate 100 and a multi-layer on the substrate 100. Hereinafter, description is made in detail on the assumption that the substrate 100 may include the first display area DA1, the second display area DA2, and the third display area DA3.

A display layer DPL may include a pixel circuit layer PCL, a display element layer, and an encapsulation member ENM, wherein the pixel circuit layer PCL may include a sub-pixel circuit PC, the display element layer may include a display element, which is a light-emitting element, and the encapsulation member ENM may include a thin-film encapsulation layer 300 or an encapsulation substrate (not shown). An insulating layer may be arranged between the substrate 100 and the display layer DPL, and inside the display layer DPL. The display element may include a light-emitting diode. In an embodiment, the display element may be an organic light-emitting diode. Hereinafter, though a light-emitting diode is described as including an organic light-emitting diode, the disclosure is not limited thereto. In an embodiment, a display element may be a light-emitting diode including an inorganic material, or a quantum-dot light-emitting diode including quantum dots. As an example, an emission layer of the display element may include an organic material, an inorganic material, quantum dots, an organic material and quantum dots, or an inorganic material and quantum dots.

The substrate 100 may include an insulating material such as glass, quartz, a polymer resin or the like within the spirit and the scope of the disclosure. The substrate 100 may be a rigid substrate, or bendable, foldable, rollable, or flexible substrate.

The pixel circuit layer PCL may be disposed on the substrate 100. The pixel circuit layer PCL may include the sub-pixel circuit PC, a connection line CWL, and an insulating layer. The sub-pixel circuit PC may include a first sub-pixel circuit PC1, a second sub-pixel circuit PC2, and a third sub0pixel circuit PC3. The first sub-pixel circuit PC1 may be arranged in the first display area DA1. The second sub-pixel circuit PC2 and the third sub-pixel circuit PC3 may be arranged in the third display area DA3. The sub-pixel circuit PC may not be arranged in the second display area DA2.

In an embodiment, a first display element DPE1 and the first sub-pixel circuit PC1 connected thereto, may be arranged in the first display area DA1 of the substrate 100. The first sub-pixel circuit PC1 may include at least one thin-film transistors and control an operation of the first display element DPE1. The first sub-pixel PX1 may be implemented by light emission of the first display element DPE1.

In an embodiment, a second display element DPE2 may be arranged in the second display area DA2 of the substrate 100 and may implement the second sub-pixel PX2. In an embodiment, as shown in FIG. 2A, the second sub-pixel circuit PC2 to drive the second display element DPE2, may not be arranged in the second display area DA2, but may be arranged in the third display area DA3 between the first display area DA1 and the second display area DA2. In an embodiment, as shown in FIG. 2B, the second sub-pixel circuit PC2 to drive the second display element DPE2, may not be arranged in the third display area DA3, but may be arranged in the non-display area NDA. For example, the second sub-pixel circuit PC2 may be arranged not to overlap the second display element DPE2.

The second sub-pixel circuit PC2 may include at least one thin-film transistor, and be electrically connected to the second display element DPE2 by the connection line CWL. The connection line CWL may include a transparent conductive material. The second sub-pixel circuit PC2 may control an operation of the second display element DPE2. The second sub-pixel PX2 may be implemented by light emission of the second display element DPE2.

A region of the second display area DA2 in which the second sub-pixel PX2 is not arranged, may be defined as the transmissive area TA. The transmissive area TA may be a region through which light or a signal emitted from the component COM, or light or a signal incident to the component COM passes, the component COM being arranged to correspond to the second display area DA2.

The connection line CWL connecting the second sub-pixel circuit PC2 to the second display element DPE2, may be arranged in the transmissive area TA. Because the connection line CWL may include a transparent conductive material having a high transmittance, even though the connection line CWL is arranged in the transmissive area TA, a transmittance of the transmissive area TA may be secured.

In an embodiment, a third display element DPE3 and the third sub-pixel circuit PC3 connected thereto, may be arranged in the third display area DA3 of the substrate 100 and may implement the third sub-pixel PX3. The second sub-pixel circuit PC2 and the third sub-pixel circuit PC3 arranged in the third display area DA3, may be adjacent to each other and alternately arranged.

As shown in FIGS. 2A and 2B, the display element layer may be covered by the thin-film encapsulation layer 300 or the encapsulation substrate. In an embodiment, the thin-film encapsulation layer 300 may include at least one inorganic encapsulation layer and at least one organic encapsulation layer. As an example, the thin-film encapsulation layer 300 may include a first inorganic encapsulation layer 310, a second inorganic encapsulation layer 330, and an organic encapsulation layer 320.

The touchscreen layer TSL may obtain coordinate information corresponding to an external input, for example, a touch event. The touchscreen layer TSL may include a touch electrode and touch lines connected to the touch electrode. The touchscreen layer TSL may sense an external input by using a self-capacitance method or a mutual capacitance method.

The touchscreen layer TSL may be formed on the thin-film encapsulation layer 300. For example, the touchscreen layer TSL may be separately formed on a touch substrate and coupled on or connected to the thin-film encapsulation layer 300 through an adhesive layer such as an optically clear adhesive (OCA). In an embodiment, the touchscreen layer TSL may be formed on or directly formed on the encapsulation layer 300. The adhesive layer may not be disposed between the touchscreen layer TSL and the encapsulation layer 300.

An optical functional layer OFL may include an anti-reflection layer. The anti-reflection layer may reduce reflectivity of light (external light) incident toward the display apparatus DV from outside. In an embodiment, the optical functional layer OFL may be a polarization film. In an embodiment, the optical functional layer OFL may include an opening (not shown) corresponding to the transmissive area TA. Accordingly, a light transmittance of the transmissive area TA may be remarkably improved. A transparent material such as an optically clear resin (OCR) may fill the opening. In an embodiment, the optical functional layer OFL may be a filter plate including a black matrix and color filters.

The panel protection member PB may be disposed under or below the substrate 100. The panel protection member PB may support and protect the substrate 100. The panel protection member PB may have an opening PB_OP overlapping the second display area DA2. In an embodiment, the opening PB_OP of the panel protection member PB may overlap the second display area DA2 and the third display area DA3. In an embodiment, the panel protection member PB may include polyethylene terephthalate or polyimide.

In an embodiment, the area of the opening PB_OP of the panel protection member PB may be greater than the area in which the component COM is arranged. Though it is shown in FIGS. 2A and 2B that the component COM is apart on one side or a side of the display panel DP, at least a portion of the component COM may be inserted into the opening PB_OP of the panel protection member PB.

The cover window (not shown) may be disposed on the display apparatus DV. The cover window may protect the display apparatus DV, for example, the display panel DP. The cover window may include at least one of glass, sapphire, and plastic. The cover window may include, for example, ultra-thin glass (UTG) or colorless polyimide (CPI).

The component COM may be arranged below the display apparatus DV. In an embodiment, the component COM may be arranged opposite the cover window (not shown) with the display panel DP therebetween. In an embodiment, the component COM may overlap the second display area DA2. In an embodiment, the component COM may overlap the second display area DA2 and the third display area DA3.

One or components COM may be arranged. The components COM may have different functions. As an example, the components COM may include at least two among a camera (a photographing element), a solar battery, a flash, a proximity sensor, an illuminance sensor, and an iris sensor.

As shown in FIGS. 2A and 2B, a bottom metal layer BML may be disposed below the sub-pixel circuit PC. The bottom metal layer BML may overlap the sub-pixel circuit PC to protect the sub-pixel circuit PC. In an embodiment, the bottom metal layer BML may be arranged to overlap the second and/or third sub-pixel circuits PC2 and PC3 between the substrate 100 corresponding to the third display area DA3, and the second sub-pixel circuit PC2 and/or the third sub-pixel circuit PC3. The bottom metal layer BML may block external light reaching the first and/or third sub-pixel circuits PC2 and PC3. The bottom metal layer BML may be disposed also below the first sub-pixel circuit PC1 of the first display area DA1. The bottom metal layer BML disposed below the first sub-pixel circuit PC1 may be apart from a bottom metal layer BML disposed below the second and/or third sub-pixel circuits PC2 and PC3. In an embodiment, the bottom metal layer BML may be provided to correspond to the display area DA entirely and may include a hole corresponding to the third display area DA3. In an embodiment, the bottom metal layer BML may be omitted.

Figure 3A:
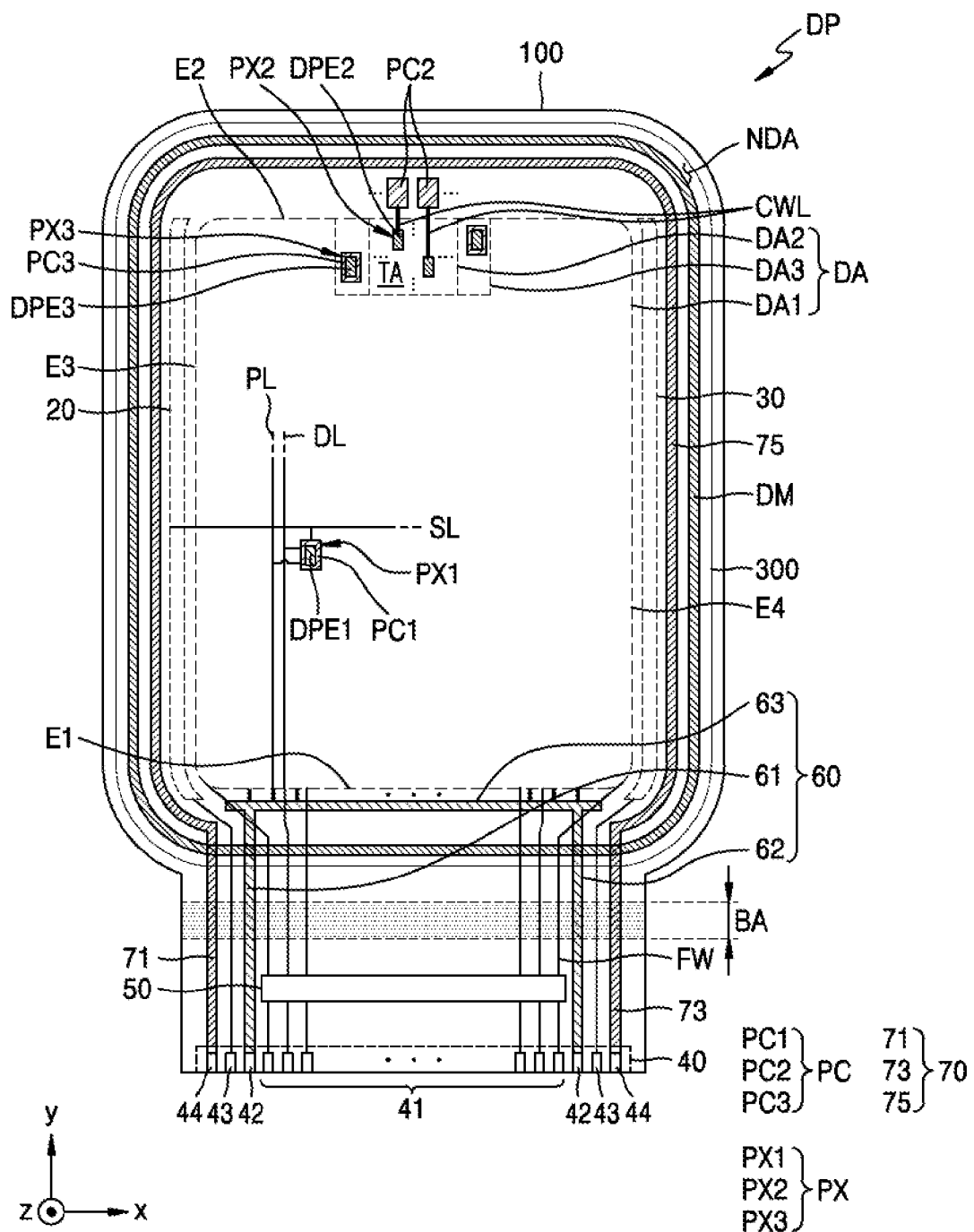
FIGS. 3A and 3B are schematic plan views of a display panel that may be included in a display apparatus according to an embodiment.
Figure 3B:
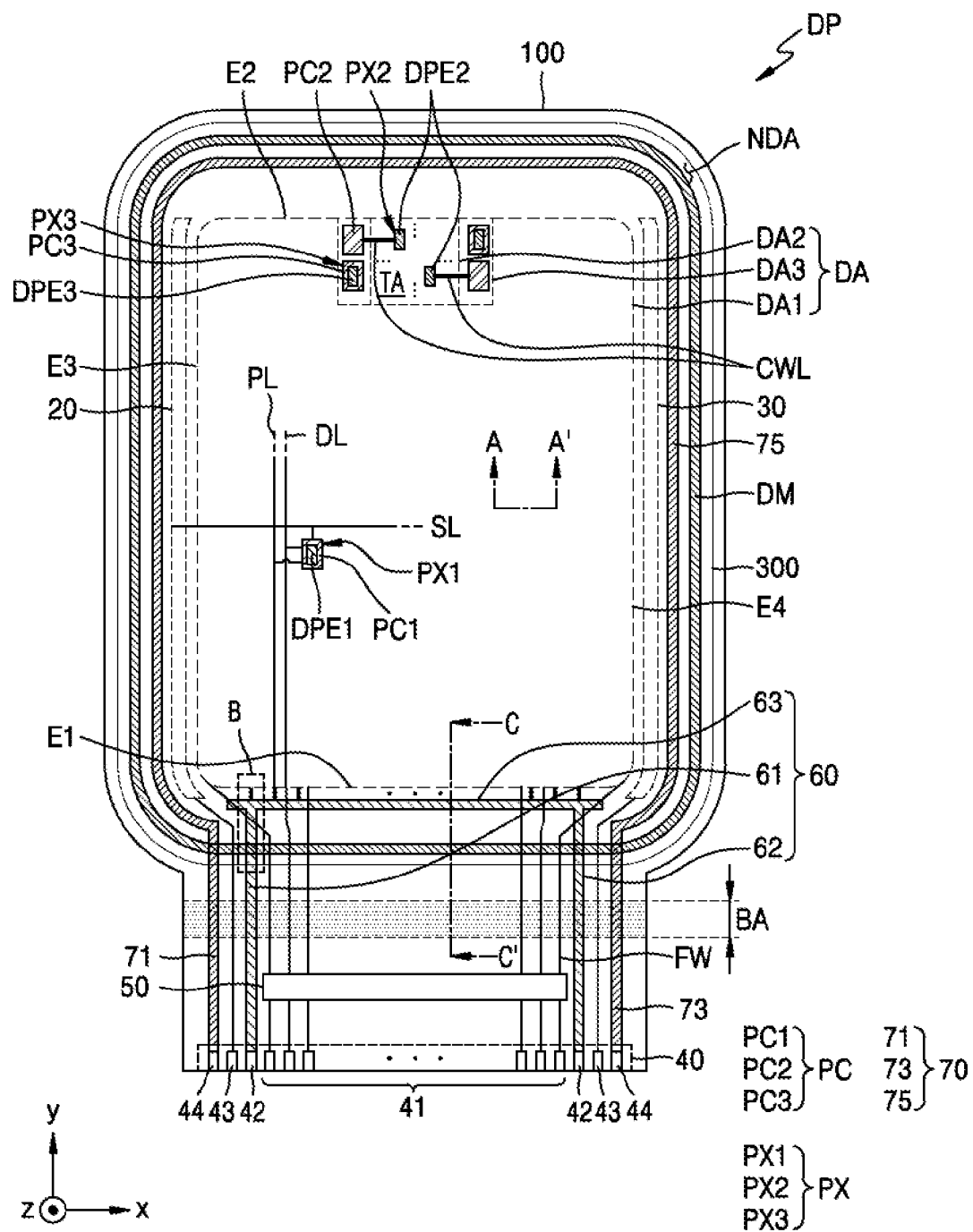

FIGS. 3A and 3B are schematic plan views of a display panel that may be included in a display apparatus according to an embodiment.

Referring to FIGS. 3A and 3B, the display panel DP may include first and second drivers 20 and 30, a terminal portion 40, a data driver 50, and a power supply line disposed on the substrate 100. The power supply line may include a driving voltage supply line 60 and a common voltage supply line 70.

The substrate 100 may include the display area DA and the non-display area NDA outside the display area DA. A portion of the non-display area NDA may extend in one side or a side (for example, a −y direction). The terminal portion 40, the data driver 50, the driving voltage supply line 60, and a fan-out wiring FW, and the like may be arranged in the non-display area NDA that extends. In an embodiment, the width in an x-axis direction of the non-display area NDA that extends may be less than the width of the display area DA in the x-axis direction.

The substrate 100 may include a bent area BA in which a portion of the non-display area NDA that extends is bent. As the non-display area NDA that extends is folded with respect to the bent area BA, the non-display area NDA that extends may partially overlap the display area DA. Through this structure, the non-display area NDA that extends may not be viewed by a user, or even though the non-display area NDA that extends is viewed by a user, a viewed area may be reduced.

Sub-pixels PX may be arranged in the display area DA. The sub-pixel circuits PC driving the sub-pixels PX in the display area DA, may each be connected to a signal line or a voltage line to control turning-on/off, brightness, and the like of a display element. As an example, FIGS. 3A and 3B show, as signal lines, a scan line SL extending in a first direction (for example, an x direction) and a data line DL extending in a second direction (for example, a y direction), and show a driving voltage line PL as a voltage line.

First sub-pixels PX1 may be arranged in the first display area DA1. The first sub-pixels PX1 may each be implemented as a light-emitting element by a display element such as an organic light-emitting diode. First sub-pixel circuits PC1 respectively driving the first sub-pixels PX1, may be arranged in the first display area DA1, and each first sub-pixel circuit PC1 may be arranged to overlap a first sub-pixel PX1 corresponding thereto. Each first sub-pixel PX1 may emit, for example, red, green, blue, or white light. The first display area DA1 may be protected from external air, moisture, or the like by being covered by the encapsulation member.

As described above, the second display area DA2 and the third display area DA3 may be located or disposed on one side or a side of the first display area DA1, or surrounded by the first display area DM. The third display area DA3 may at least partially surround the second display area DA2. Second sub-pixels PX2 may be arranged in the second display area DA2, and third sub-pixels PX3 may be arranged in the third display area DA3. The second sub-pixels PX2 and the third sub-pixels PX3 may each be implemented as a light-emitting element by a display element such as an organic light-emitting diode. The second sub-pixels PX2 and the third sub-pixels PX3 may each emit, for example, red, green, blue, or white light. The second display area DA2 and the third display area DA3 may be protected from external air, moisture, or the like by being covered by the encapsulation member.

The second sub-pixel PX2 may be implemented in the second display area DA2, and the third sub-pixel PX3 may be implemented in the third display area DA3. For example, it may be understood that the second sub-pixel PX2 substantially emits light in the second display area DA2, and the third sub-pixel PX3 substantially emits light in the third display area DA3.

Referring to FIG. 3A, because a second display element DPE2 implementing the second sub-pixel PX2 is arranged in the second display area DA2, and the second sub-pixel circuit PC2 is arranged in the third display area DA3, the second display element DPE2 may be connected to the second sub-pixel circuit PC2 by a connection line CWL.

In an embodiment, referring to FIG. 3B, because a second display element DPE2 implementing the second sub-pixel PX2 is arranged in the second display area DA2, and the second sub-pixel circuit PC2 is arranged in the non-display area NDA, the second display element DPE2 may be connected to the second sub-pixel circuit PC2 by a connection line CWL.

As described above, in the case where the second sub-pixel circuit PC2 including the signal lines, the transistors, and the storage capacitor, is arranged in the third display area DA3 or the non-display area NDA, and the second display element DPE2 is arranged in the third display area DA3, the area of the transmissive area TA may be increased with the resolution in the second display area DA2 maintained.

The first to third sub-pixel circuits PC1, PC2, and PC3 respectively driving the first to third sub-pixels PX1, PX2, and PX3, may each be electrically connected to outer circuits arranged in the non-display area NDA. The first and second drivers 20 and 30, the terminal portion 40, the data driver 50, the driving voltage supply line 60, and the common voltage supply line 70, may be arranged in the non-display area NDA.

The first scan driver 20 and the second scan driver 30 may generate a scan signal and transfer the scan signal to each sub-pixel circuit PC through the scan line SL. In an embodiment, one of the first scan driver 20 and the second scan driver 30 may apply an emission control signal to each sub-pixel circuit PC through an emission control line. In an embodiment, though a structure in which the first and second scan drivers 20 and 30 are respectively arranged on two opposite sides of the display area DA, the scan drivers may be arranged on only one side or a side of the display area DA in an embodiment. The second scan driver 30 may be arranged to be symmetrical to the first scan driver 20 with respect to the display area DA.

The data driver 50 may generate a data signal and transfer the data signal to each sub-pixel circuit PC through the data line DL. The data driver 50 may be arranged on one side or a side of the display area DA and arranged in the non-display area NDA that extends below (for example, a −y direction) the display area DA. Though it is shown in FIGS. 3A and 3B that the data driver 50 is disposed on the substrate 100, the data driver 50 may be provided on a flexible printed circuit board connected to the terminal portion 40 in an embodiment.

The terminal portion 40 is arranged on one end or an end of the substrate 100 and may include terminals 41, 42, 43, and 44. The terminal portion 40 may be exposed without being covered by an insulating layer, and electrically connected to a controller such as a flexible printed circuit board or an integrated circuit (IC) chip. Control signals of the controller may be respectively provided to the first and second drivers 20 and 30, the terminal portion 40, the data driver 50, the driving voltage supply line 60, and the common voltage supply line 70 through the terminal portion 40.

The driving voltage supply line 60 may be arranged in the non-display area NDA. The driving voltage supply line 60 may provide a driving voltage ELVDD to each sub-pixel PX. In an embodiment, the driving voltage supply line 60 may include a first driving voltage supply line 61, a second driving voltage supply line 62, and a third driving voltage supply line 63. The third driving voltage supply line 63 may extend in the first direction (for example, the x direction), and the first and second driving voltage lines 61 and 62 may extend in the second direction (for example, the y direction). As an example, the third driving voltage supply line 63 may be arranged along a first edge E1 of the display area DA. In an embodiment, the first driving voltage supply line 61, the second driving voltage supply line 62, and the third driving voltage supply line 63 may be integrally provided. As an example, the driving voltage supply line 60 may have a 'Π'(pi) shape as one body. However, the disclosure is not limited thereto.

The driving voltage supply line 60 may be arranged in the non-display area NDA and connected to the driving voltage lines PL extending to the display area DA in the second direction (for example, the y direction). As an example, the third driving voltage supply line 63 may be connected to the driving voltage line PL crossing the display area DA in the second direction (for example, the y direction).

The common voltage supply line 70 may be arranged in the non-display area NDA and provide a common voltage ELVSS to each sub-pixel PX. The common voltage supply line 70 may include a first common voltage supply line 71 and a second common voltage supply line 73 arranged adjacent to the first edge E1 of the display area DA. The first common voltage supply line 71 and the second common voltage supply line 73 may each extend in the second direction (for example, the y direction). The first common voltage supply line 71 may be apart from the second common voltage supply line 73 (for example, the y direction) in the first direction (for example, the x direction) crossing the second direction (for example, the y direction). The first common voltage supply line 71 and the second common voltage supply line 73 may be respectively arranged on two opposite sides of the first edge E1 of the display area DA. However, the disclosure is not limited thereto. The common voltage supply line may further include a third common voltage supply line arranged between the first common voltage supply line 71 and the second common voltage supply line 73. In the case where the common voltage supply line 70 may include the third common voltage supply line arranged between the first common voltage supply line 71 and the second common voltage supply line 73, a current density may be reduced and heat emission may be suppressed upon application of a current compared to the case where only the first common voltage supply line 71 and the second common voltage supply line 73 are provided.

The first common voltage supply line 71 may be connected to the second common voltage supply line 73 by a body portion 75 extending along a second edge E2, a third edge E3, and a fourth edge E4 of the display area DA. In an embodiment, the first common voltage supply line 71, the second common voltage supply line 73, and the body portion 75 may be integral with each other.

A dam DM may be arranged in the non-display area NDA. The dam DM may be arranged to surround the outer block of the display area DA. The dam DM may be arranged outside the common voltage supply line 70, or arranged to partially overlap the common voltage supply line 70.

The thin-film encapsulation layer 300 may be arranged in the display area DA to cover the sub-pixels PX, and a portion of the thin-film encapsulation layer 300 may extend to the non-display area NDA. The thin-film encapsulation layer 300 has a multi-layered structure including at least one organic encapsulation layer and at least one inorganic encapsulation layer. The dam DM may prevent an organic encapsulation layer-forming material included in the thin-film encapsulation layer 300, from diffusing to the edge of the substrate 100, and restrict a forming position of the organic encapsulation layer.

Figure 4:
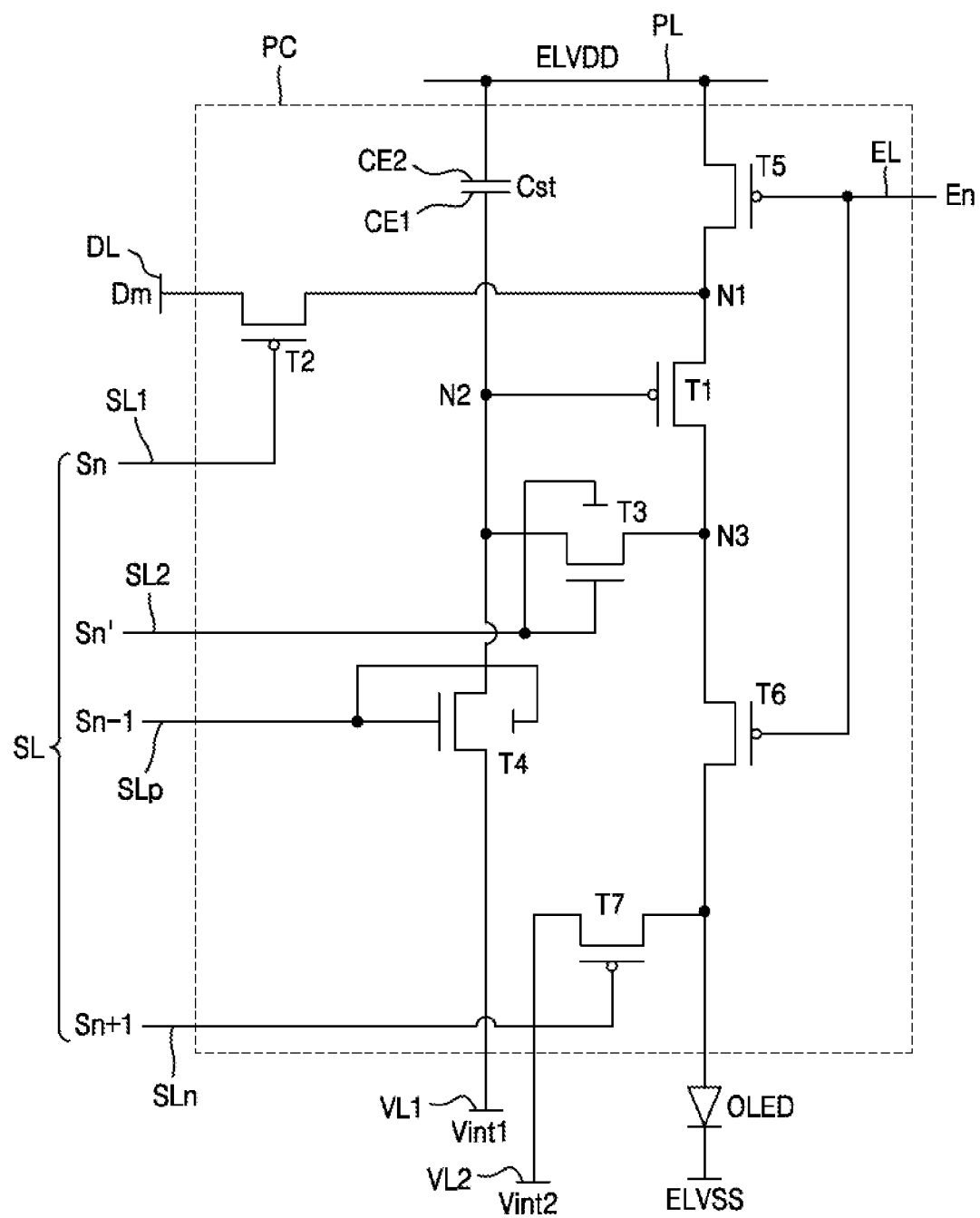
FIG. 4 is a schematic equivalent circuit diagram of a display element of a display apparatus and a sub-pixel circuit electrically connected thereto, according to an embodiment.

FIG. 4 is a schematic equivalent circuit diagram of the sub-pixel circuit PC electrically connected to a light-emitting diode corresponding to a sub-pixel of a display apparatus according to an embodiment.

The sub-pixel circuit PC shown in FIG. 4 may correspond to each of the first sub-pixel circuit PC1, the second sub-pixel circuit PC2, and the third sub-pixel circuit PC3 described with reference to FIGS. 3A and 3B.

An organic light-emitting diode OLED, which is the display element shown in FIG. 4, may correspond to each of the first display element DPE1, the second display element DPE2, and the third display element DPE3 described with reference to FIGS. 3A and 3B.

Referring to FIG. 4, the sub-pixel circuit PC may include thin-film transistors T1, T2, T3, T4, T5, T6, and T7, and a storage capacitor Cst. The thin-film transistors T1, T2, T3, T4, T5, T6, and T7 and the storage capacitor Cst may be connected to signal lines SL1, SL2, SLp, SLn, EL, and DL, a first initialization voltage line VL1, a second initialization voltage line VL2, and the driving voltage line PL. At least one of the lines, for example, the driving voltage line PL may be shared by the sub-pixel circuits PC adjacent to each other.

In an embodiment, the thin-film transistors T1, T2, T3, T4, T5, T6, and T7 may include a driving transistor T1, a switching transistor T2, a compensation transistor T3, a first initialization transistor T4, an operation control transistor T5, an emission control transistor T6, and a second initialization transistor T7. However, the disclosure is not limited thereto.

The organic light-emitting diode OLED may include a pixel electrode and an opposite electrode. The pixel electrode of the organic light-emitting diode OLED may be connected to the driving transistor T1 through the emission control transistor T6 and may receive a driving current, and the opposite electrode may receive the common voltage ELVSS. The organic light-emitting diode OLED may generate light of brightness corresponding to the driving current.

Some or a number of the thin-film transistors T1, T2, T3, T4, T5, T6, and T7 may be n-channel metal-oxide semiconductor field-effect transistors (n-channel MOSFETs; NMOS), and the rest may be p-channel metal-oxide semiconductor field-effect transistors (p-channel MOSFETs; PMOs). As an example, among the thin-film transistors T1, T2, T3, T4, T5, T6, and T7, the compensation transistor T3 and the first initialization transistor T4 may be NMOS, and the rest may be PMOS. For example, among the thin-film transistors T1, T2, T3, T4, T5, T6, and T7, the compensation transistor T3, the first initialization transistor T4, and the second initialization transistor T7 may be NMOS, and the rest may be PMOS. For example, the thin-film transistors T1, T2, T3, T4, T5, T6, and T7 may all be NMOS or all be PMOS. The thin-film transistors T1, T2, T3, T4, T5, T6, and T7 may each include amorphous silicon or polycrystalline silicon. In case that needed, a transistor, which is an NMOS, may include an oxide semiconductor. Hereinafter, for convenience of description, the case where the compensation transistor T3 and the first initialization transistor T4 are NMOS including an oxide semiconductor, and the rest are PMOS, is described.

The signal lines may include a first scan line SL1, a second scan line SL2, a previous scan line SLp, a next scan line SLn, an emission control line EL, and the data line DL. However, the disclosure is not limited thereto. The first scan line SL1 may transfer a first scan signal Sn. The second scan line SL2 may transfer a second scan signal Sn'. The previous scan line SLp may transfer a previous scan signal Sn−1 to the first initialization transistor T4. The next scan line SLn may transfer a next scan signal Sn+1 to the second initialization transistor T7. The emission control line EL may transfer an emission control signal En to the operation control transistor T5 and the emission control transistor T6. The data line DL may transfer a data signal Dm.

The driving voltage line PL may transfer the driving voltage ELVDD to the driving transistor T1, the first initialization voltage line VL1 may transfer a first initialization voltage Vint1 initializing the driving transistor T1, and the second initialization voltage line VL2 may transfer a second initialization voltage Vint2 initializing the pixel electrode of the organic light-emitting diode OLED.

A driving gate electrode of the driving transistor T1 may be connected to the storage capacitor Cst through a second node N2, one of a source region and a drain region of the driving transistor T1 may be connected to a driving voltage line PL through the operation control transistor T5 via a first node N1, and the other of the source region and the drain region of the driving transistor T1 may be electrically connected to the pixel electrode of the organic light-emitting diode OLED through the emission control transistor T6 via a third node N3. The driving transistor T1 may receive a data signal Dm in response to a switching operation of the switching transistor T2 and supply the driving current to the organic light-emitting diode OLED. For example, the driving transistor T1 may control the amount of current flowing from the first node N1 to the organic light-emitting diode OLED in response to a voltage applied to the second node N2 and changed by a data signal Dm, the first node N1 being electrically connected to the driving voltage line PL.

A switching gate electrode of the switching transistor T2 may be connected to the first scan line SL1 to transfer a first scan signal Sn, one of a source region and a drain region of the switching transistor T2 may be connected to the data line DL, and the other of the source region and the drain region of the switching transistor T2 may be connected to the driving transistor T1 through the first node N1 and connected to the driving voltage line PL through the operation control transistor T5. The switching transistor T2 may transfer a data signal Dm from the data line DL to the first node N1 in response to a voltage applied to the first scan line SL1. For example, the switching transistor T2 may be turned on according to a first scan signal Sn transferred through the first scan line SL1 and perform a switching operation for transferring a data signal Dm to the driving transistor T1 through the first node N1, the data signal Dm being transferred through the data line DL.

A compensation gate electrode of the compensation transistor T3 is connected to the second scan line SL2. One of a source region and a drain region of the compensation transistor T3 may be connected to the pixel electrode of the organic light-emitting diode OLED through the emission control transistor T6 via the third node N3. The other of the source region and the drain region of the compensation transistor T3 may be connected to a first capacitor electrode CE1 of the storage capacitor Cst, and the driving gate electrode of the driving transistor T1 through the second node N2. The compensation transistor T3 may diode-connect the driving transistor T1 by being turned on according to a second scan signal Sn' received through the second scan line SL2.

A first initialization gate electrode of the first initialization transistor T4 may be connected to the previous scan line SLp. One of a source region and a drain region of the first initialization transistor T4 may be connected to the first initialization voltage line VL1. The other of the source region and the drain region of the first initialization transistor T4 may be connected to the first capacitor electrode CE1 of the storage capacitor Cst, and the driving gate electrode of the driving transistor T1 through the second node N2. The first initialization transistor T4 may apply the first initialization voltage Vint1 from the first initialization voltage line VL1 to the second node N2 according to a voltage applied to the previous scan line SLp. For example, the first initialization transistor T4 may be turned on according to a previous scan signal Sn−1 received through the previous scan line SLp and may perform an initialization operation of initializing the voltage of the driving gate voltage of the driving transistor T1 by transferring the first initialization voltage Vint1 to the driving gate electrode of the driving transistor T1.

An operation control gate electrode of the operation control transistor T5 may be connected to the emission control line EL, one of a source region and a drain region of the operation control transistor T5 may be connected to the driving voltage line PL, and the other of the source region and the drain region of the operation control transistor T5 may be connected to the driving transistor T1 and the switching transistor T2 through the first node N1.

An emission control gate electrode of the emission control transistor T6 may be connected to the emission control line EL, one of a source region and a drain region of the emission control transistor T6 may be connected to the driving transistor T1 and the compensation transistor T3 through the third node N3, and the other of the source region and the drain region of the emission control transistor T6 may be electrically connected to the pixel electrode of the organic light-emitting diode OLED.

The operation control transistor T5 and the emission control transistor T6 may be simultaneously turned on according to an emission control signal En transferred through the emission control line EL, the driving voltage ELVDD is transferred to the organic light-emitting diode OLED, and the driving current flows through the organic light-emitting diode OLED.

A second initialization gate electrode of the second initialization transistor T7 may be connected to the next scan line SLn, one of a source region and a drain region of the second initialization transistor T7 may be connected to the pixel electrode of the organic light-emitting diode OLED, and the other of the source region and the drain region of the second initialization transistor T7 may be electrically connected to the second initialization voltage line VL2 to receive the second initialization voltage Vint2. The second transistor T7 may be turned on according to a next scan signal Sn+1 transferred through the next scan line SLn and may initialize the pixel electrode of the organic light-emitting diode OLED. The next scan line SLn the first scan line SL1 may be the same line. The relevant scan line may transfer the same electric signal with a time difference, and thus, may serve as the first scan line SL1 and as the next scan line SLn. For example, the next scan line SLn may be adjacent to the sub-pixel circuit PC shown in FIG. 4 and be the first scan line of another sub-pixel circuit electrically connected to the same data line DL.

The storage capacitor Cst may include the first capacitor electrode CE1 and a second capacitor electrode CE2. The first capacitor electrode CE1 of the storage capacitor Cst may be connected to the driving gate electrode of the driving transistor T1 through the second node N2, and the second capacitor electrode CE2 of the storage capacitor Cst may be connected to the driving voltage line PL. The storage capacitor Cst may store charge corresponding to a difference between a voltage of the driving gate of the driving transistor T1 and the driving voltage ELVDD.

Operations of the sub-pixel circuit PC and the organic light-emitting diode OLED, which is a display element, according to an embodiment, are described below.

During an initialization period, in case that a previous scan signal Sn−1 is supplied through the previous scan line SLp, the first initialization transistor T4 is turned on according to the previous scan signal Sn−1, and the driving transistor T1 may be initialized by the first initialization voltage Vint1 supplied from the first initialization voltage line VL1.

During a data programming period, in case that a first scan signal Sn and a second scan signal Sn' are supplied through the first scan line SL1 and the second scan line SL2, the switching transistor T2 and the compensation transistor T3 may be turned on according to the first scan signal Sn and the second scan signal Sn'. The driving transistor T1 may be diode-connected and forward-biased by the compensation transistor T3 that is turned on. A compensation voltage (Dm+Vth (Vth has a −value)) may be applied to the driving gate electrode of the driving transistor T1, wherein the compensation voltage (Dm+Vth) is obtained by subtracting a threshold voltage Vth of the driving transistor T1 from a data signal Dm supplied from the data line DL. The driving voltage ELVDD and the compensation voltage (Dm+Vth) are respectively applied to two opposite ends of the storage capacitor Cst, and charge corresponding to a difference between voltages of the two opposite ends may be stored in the storage capacitor Cst.

During an emission period, the operation control transistor T5 and the emission control transistor T6 may be turned on according to an emission control signal En supplied from the emission control line EL. The driving current corresponding to a voltage difference between the voltage of the driving gate electrode of the driving transistor T1 and the driving voltage ELVDD occurs, and the driving current is supplied to the organic light-emitting diode OLED through the emission control transistor T6.

As described above, some or a number of the thin-film transistors T1, T2, T3, T4, T5, T6, and T7 may include an oxide semiconductor. As an example, the compensation transistor T3 and the first initialization transistor T4 may include an oxide semiconductor. However, the disclosure is not limited thereto.

Figure 5:
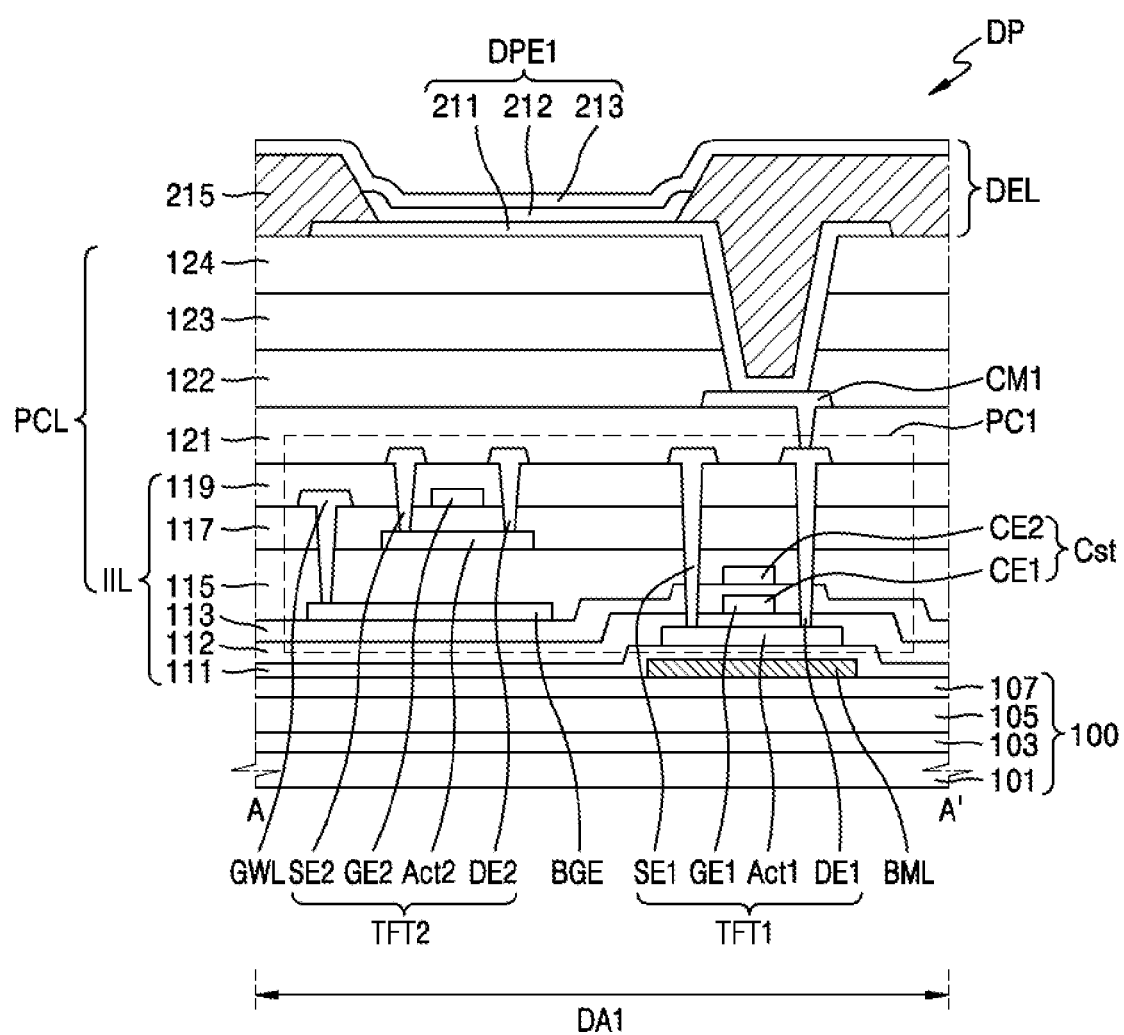
FIG. 5 is a schematic cross-sectional view of a portion of a display apparatus, taken along line A-A' of FIG. 3B, according to an embodiment.

FIG. 5 is a cross-sectional view of a portion of the display apparatus according to an embodiment, showing the display panel DP, taken along line A-A' of FIG. 3B.

Referring to FIG. 5, the display panel DP may include the substrate 100, the pixel circuit layer PCL, and a display element layer DEL.

The substrate 100 may include glass or polymer resin. In an embodiment, the substrate 100 may have a stack structure in which a base layer including a polymer resin and a barrier layer including an inorganic insulating material such as silicon oxide or silicon nitride may be alternately stacked each other. As an example, the substrate 100 may include a first base layer 101, a first barrier layer 103, a second base layer 105, and a second barrier layer 107. The first base layer 101 and the second base layer 105 may each include a polymer resin, and the first barrier layer 103 and the second barrier layer 107 may each include an inorganic insulating material. The polymer resin may include polyethersulfone, polyarylate, polyetherimide, polyethylene naphthalate, polyethylene terephthalate, polyphenylene sulfide, polyimide, polycarbonate, cellulose triacetate, cellulose acetate propionate, and the like within the spirit and the scope of the disclosure.

The pixel circuit layer PCL may be disposed on the substrate 100. The pixel circuit layer PCL may include a first pixel circuit PC1, an inorganic insulating layer IIL, a first organic insulating layer 121, a second organic insulating layer 122, a third organic insulating layer 123, and a fourth organic insulating layer 124. In an embodiment, the inorganic insulating layer BL may include a buffer layer 111, a first gate insulating layer 112, a second gate insulating layer 113, a first inorganic insulating layer 115, a second inorganic insulating layer 117, and an interlayer insulating layer 119.

The first sub-pixel circuit PC1 may be arranged in the first display area DAL As described above with reference to FIG. 4, the first sub-pixel circuit PC1 may include the transistors and the storage capacitor. FIG. 5 shows a first thin-film transistor TFT1, a second thin-film transistor TFT2, and the storage capacitor Cst. The first thin-film transistor TFT1 may include a first semiconductor layer Act1, a first gate electrode GE1, a first source electrode SE1, and a first drain electrode DE1. The second thin-film transistor TFT2 may include a second semiconductor layer Act2, a second gate electrode GE2, a second source electrode SE2, and a second drain electrode DE2. The storage capacitor Cst may include the first capacitor electrode CE1 and the second capacitor electrode CE2.

The buffer layer 111 may be disposed on the substrate 100. The buffer layer 111 may reduce or block penetration of foreign materials, moisture, or external air from below the substrate 100. The buffer layer 111 may include an inorganic material such as silicon nitride, silicon oxynitride, and silicon oxide, and include a single-layer or a multi-layer including the above materials.

The first semiconductor layer Act1 may include a silicon semiconductor. The first semiconductor layer Act1 may include polycrystalline silicon. For example, the first semiconductor layer Act1 may include amorphous silicon. In an embodiment, the first semiconductor layer Act1 may include an oxide semiconductor, an organic semiconductor or the like within the spirit and the scope of the disclosure. The first semiconductor layer Act1 may include a channel region, a drain region, and a source region, the drain region and the source region being on two opposite sides of the channel region. The first gate electrode GE1 may overlap the channel region.

The first gate electrode GE1 may overlap the first semiconductor layer Act1. The first gate electrode GE1 may include a low-resistance metal material. The first gate electrode GE1 may include a conductive material including molybdenum (Mo), aluminum (Al), copper (Cu), and titanium (Ti) and have a single-layered structure or a multi-layered structure including the above materials.

The first gate insulating layer 112 may be disposed between the first semiconductor layer Act1 and the first gate electrode GE1. Accordingly, the first semiconductor layer Act1 may be insulated from the first gate electrode GE1. The first gate insulating layer 112 may include an inorganic insulating material such as silicon oxide, silicon nitride, silicon oxynitride, aluminum oxide, titanium oxide, tantalum oxide, hafnium oxide, and/or zinc oxide.

The second gate insulating layer 113 may cover the first gate electrode GE1. The second gate insulating layer 113 may be disposed on the first gate electrode GE1. Similarly to the first gate insulating layer 112, the second gate insulating layer 113 and may include an inorganic insulating material such as silicon oxide, silicon nitride, silicon oxynitride, aluminum oxide, titanium oxide, tantalum oxide, hafnium oxide, and/or zinc oxide.

The second capacitor electrode CE2 may be disposed on the second gate insulating layer 113. The second capacitor electrode CE2 may overlap the first gate electrode GE1 therebelow. The second capacitor electrode CE2 may overlap the first gate electrode GE1 with the second gate insulating layer 113 therebetween to constitute the storage capacitor Cst. For example, the first gate electrode GE1 of the first thin-film transistor TFT1 may serve as the first electrode CE1 of the storage capacitor Cst.

As described above, the storage capacitor Cst may overlap the first thin-film transistor TFT1. In an embodiment, the storage capacitor Cst may be formed not to overlap the first thin-film transistor TFT1.

The second capacitor electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu), and include a single layer or a multi-layer including the above materials.

The first inorganic insulating layer 115 may cover the second capacitor electrode CE2. In an embodiment, the first inorganic insulating layer 115 may cover the first gate electrode GE1. The first inorganic insulating layer 115 may include silicon oxide, silicon nitride, silicon oxynitride, aluminum oxide, titanium oxide, tantalum oxide, hafnium oxide, or zinc oxide. The first inorganic insulating layer 115 may include a single layer or a multi-layer including the inorganic insulating material.

The second semiconductor layer Act2 may be disposed on the first inorganic insulating layer 115. In an embodiment, the second semiconductor layer Act2 may include a channel region, a drain region, and a source region, the drain region and the source region being respectively on two opposite sides of the channel region. The second semiconductor layer Act2 may include an oxide semiconductor. As an example, the second semiconductor layer Act2 may include Zn-oxide-based material and include Zn-oxide, In—Zn oxide, and Ga—In—Zn oxide. For example, the second semiconductor layer Act2 may include In—Ga—Zn—O (IGZO), In—Sn—Zn—O (ITZO), or In—Ga—Sn—Zn—O (IGTZO) semiconductor containing metal such as indium (In), gallium (Ga), and stannum (Sn) in ZnO.

The source region and the drain region of the second semiconductor layer Act2 may be formed by adjusting a carrier concentration of the oxide semiconductor and making the relevant regions conductive. For example, the source region and the drain region of the second semiconductor layer Act2 may be formed by increasing carrier concentration through plasma treatment that uses a hydrogen-based gas, a fluorine-based gas, or a combination of these performed on the oxide semiconductor.

The second inorganic insulating layer 117 may cover the second semiconductor layer Act2. The second inorganic insulating layer 117 may be disposed between the second semiconductor layer Act2 and the second gate electrode GE2. In an embodiment, the second inorganic insulating layer 117 may be disposed on the substrate 100 entirely. In an embodiment, the second inorganic insulating layer 117 may be patterned along the shape of the second gate electrode GE2. The second inorganic insulating layer 117 may include silicon oxide, silicon nitride, silicon oxynitride, aluminum oxide, titanium oxide, tantalum oxide, hafnium oxide, or zinc oxide. The second inorganic insulating layer 117 may include a single layer or a multi-layer including the inorganic insulating material.

The second gate electrode GE2 may be disposed on the second inorganic insulating layer 117. The second gate electrode GE2 may overlap the second semiconductor layer Act2. The second gate electrode GE2 may overlap the channel region of the second semiconductor layer Act2. The second gate electrode GE2 may include a conductive material including molybdenum (Mo), aluminum (Al), copper (Cu), and titanium (Ti) and have a single-layered structure or a multi-layered structure including the above materials.

The interlayer insulating layer 119 may cover the second capacitor electrode CE2. The interlayer insulating layer 119 may include silicon oxide, silicon nitride, silicon oxynitride, aluminum oxide, titanium oxide, tantalum oxide, hafnium oxide, or zinc oxide. The interlayer insulating layer 119 may include a single layer or a multi-layer including the inorganic insulating material.

The first source electrode SE1 and the first drain electrode DE1 may be disposed on the interlayer insulating layer 119. The first source electrode SE1 and the first drain electrode DE1 may be connected to the first semiconductor layer Act1. The first source electrode SE1 and the first drain electrode DE1 may be connected to the first semiconductor layer Act1 through contact holes of the insulating layers.

The second source electrode SE2 and the second drain electrode DE2 may be disposed on the interlayer insulating layer 119. The second source electrode SE2 and the second drain electrode DE2 may be electrically connected to the second semiconductor layer Act2. The second source electrode SE2 and the second drain electrode DE2 may be electrically connected to the second semiconductor layer Act2 through contact holes of the insulating layers.

The first source electrode SE1, the first drain electrode DE1, the second source electrode SE2, and the second drain electrode DE2 may each include a material having high conductivity. The first source electrode SE1, the first drain electrode DE1, the second source electrode SE2, and the second drain electrode DE2 may each include a conductive material including molybdenum (Mo), aluminum (Al), copper (Cu), titanium (Ti), and the like, and include a multi-layer or a single layer including the above materials. In an embodiment, the first source electrode SE1, the first drain electrode DE1, the second source electrode SE2, and the second drain electrode DE2 may each include have a multi-layered structure of Ti/Al/Ti.

The first thin-film transistor TFT1 including the first semiconductor layer Act1 including the silicon semiconductor, may have high reliability. As an example, the first thin-film transistor TFT1 may be the driving transistor T1 (see FIG. 4). The display panel DP of a high quality may be implemented.

Because the oxide semiconductor has high carrier mobility and a low leakage current, a voltage drop may not be large even in case that a driving time is long. For example, because a color change of an image according to a voltage drop is not large even while the display apparatus is driven in low frequencies, the display apparatus may be driven in low frequencies. Because the oxide semiconductor has an advantage of a small leakage current, at least one of the transistors besides the driving transistor may employ the oxide semiconductor, and thus, a leakage current may be prevented, and simultaneously, power consumption may be reduced. As an example, the second thin-film transistor TFT2 may be the compensation transistor T3 (see FIG. 4).

A bottom gate electrode BGE may be disposed below the second semiconductor layer Act2. In an embodiment, the bottom gate electrode BGE may be disposed between the second gate insulating layer 113 and the first inorganic insulating layer 115. In an embodiment, the bottom gate electrode BGE may receive a gate signal. The second thin-film transistor TFT2 may have a double gate electrode structure in which gate electrodes are disposed over and below the second semiconductor layer Act2.

In an embodiment, a gate line GWL may be disposed between the second inorganic insulating layer 117 and the interlayer insulating layer 119. In an embodiment, the gate line GWL may be electrically connected to the bottom gate electrode BGE through contact holes provided in the first inorganic insulating layer 115 and the second inorganic insulating layer 117.

In an embodiment, a bottom metal layer BML may be disposed between the substrate 100 and the first sub-pixel circuit PC1 that overlaps the first display area DA1. In an embodiment, the bottom metal layer BML may overlap the first thin-film transistor TFT1. A constant voltage may be applied to the bottom metal layer BML. Because the bottom metal layer BML is disposed below the first thin-film transistor TFT1, the first thin-film transistor TFT1 is less influenced by neighboring interference signals, and thus, the reliability of the first thin-film transistor TFT1 may be improved.

The first organic insulating layer 121 may cover the first source electrode SE1, the first drain electrode DE1, the second source electrode SE2, and the second drain electrode DE2. The first organic insulating layer 121 may include an organic material. As an example, the first organic insulating layer 121 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

A first connection electrode CM1 may be disposed on the first organic insulating layer 121. The connection electrode CM1 may be connected to the first drain electrode DE1 or the first source electrode SE1 through a contact hole of the first organic insulating layer 121.

The first connection electrode CM1 may include a material having a high conductivity. The first connection electrode CM1 may include a conductive material including molybdenum (Mo), aluminum (Al), copper (Cu), and titanium (Ti) and have a single-layered structure or a multi-layered structure including the above materials. In an embodiment, the first connection electrode CM1 may have a multi-layered structure of Ti/Al/Ti.

The second organic insulating layer 122, the third organic insulating layer 123, and the fourth organic insulating layer 124 may each cover the first connection electrode CM1. The second organic insulating layer 122, the third organic insulating layer 123, and the fourth organic insulating layer 124 may each include an organic material. As an example, at least one of the second organic insulating layer 122, the third organic insulating layer 123, and the fourth organic insulating layer 124 may include an organic insulating material including a general-purpose polymer such as PMMA or PS, polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

Though it is shown in FIG. 5 that the pixel circuit layer PCL may include the first organic insulating layer 121, the second organic insulating layer 122, the third organic insulating layer 123, and the fourth organic insulating layer 124, the disclosure is not limited thereto. As an example, at least one of the first organic insulating layer 121, the second organic insulating layer 122, the third organic insulating layer 123, and the fourth organic insulating layer 124, may be omitted.

The display element layer DEL may be disposed on the pixel circuit layer PCL. The display element layer DEL may include the display element. In an embodiment, the display element layer DEL may include a first display element DPE1 arranged in the first display area DA1. The first display element DPE1 may be an organic light-emitting diode. The first display element DPE1 may be disposed on the fourth organic insulating layer 124.

The first display element DPE1 may be electrically connected to the first sub-pixel circuit PC1. In the first display area DA1, the first display element DPE1 may be electrically connected to the first sub-pixel circuit PC1 and may implement the first sub-pixel PX1. In an embodiment, the first display element DPE1 may overlap the first sub-pixel circuit PC1. The first display element DPE1 is an organic light-emitting diode and may include a pixel electrode 211, an emission layer 212, and an opposite electrode 213.

The pixel electrode 211 may be disposed on the fourth organic insulating layer 124. The pixel electrode 211 may be electrically connected to the first connection electrode CM1 through a contact hole provided in the second organic insulating layer 122, the third organic insulating layer 123, and the fourth organic insulating layer 124.

The pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. For example, the pixel electrode 211 may further include a conductive oxide material layer on and/or under or below the reflective layer. The conductive oxide material layer may include indium tin oxide (ITO), indium zinc oxide (IZO), zinc oxide (ZnO), indium oxide ($In_2O_3$), indium gallium oxide (IGO), and/or aluminum zinc oxide (AZO). In an embodiment, the pixel electrode 211 may have a three-layered structure of ITO/Ag/ITO.

A first bank layer 215 may be disposed on the pixel electrode 211. A first opening that exposes at least a portion of the pixel electrode 211, may be defined in the first bank layer 215. The central portion of the first pixel electrode 211 may be exposed through the first opening defined in the bank layer 215. The first opening may define an emission area of light emitted from the first display element DPE1.

The first bank layer 215 may include an organic insulating material. In an embodiment, the first bank layer 215 may include an inorganic insulating material such as silicon nitride, silicon oxynitride, or silicon oxide. In an embodiment, the first bank layer 215 may include an organic insulating material and an inorganic insulating material. In an embodiment, the first bank layer 215 may include a light-blocking material and be provided in black. The light-blocking material may include carbon black, carbon nanotubes, a resin or paste including black dye, metal particles, for example, nickel, aluminum, molybdenum, and an alloy thereof, metal oxide particles (for example, chrome oxide) or metal nitride particles (for example, chrome nitride). In the case where the first bank layer 215 may include a light-blocking material, external light reflection by metal structures arranged below the first bank layer 215 may be reduced.

The emission layer 212 may be disposed on the pixel electrode 211. The emission layer 212 may overlap the first opening of the pixel electrode 211. The emission layer 212 may include a low-molecular weight material or a polymer material, and emit red, green, blue, or white light. In an embodiment, the emission layer 212 may be patterned to correspond to each of the pixel electrodes 211. In an embodiment, the emission layer 212 may be integral with each other over the pixel electrodes 211.

In an embodiment, a hole injection layer (HIL) and/or a hole transport layer (HTL) may be disposed between the pixel electrode 211 and the emission layer 212.

The opposite electrode 213 may be disposed on the emission layer 212. The opposite electrode 213 may include a conductive material having a low work function. As an example, the opposite electrode 213 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), or an alloy thereof. For example, the opposite electrode 213 may further include a layer on the (semi) transparent layer, the layer including ITO, IZO, ZnO, or $In_2O_3$. In an embodiment, the opposite electrode 213 may be disposed to cover the display area DA entirely.

In an embodiment, an electron transport layer (ETL) and/or an electron injection layer (EIL) may be disposed between the emission layer 212 and the opposite electrode 213.

Figure 6A:
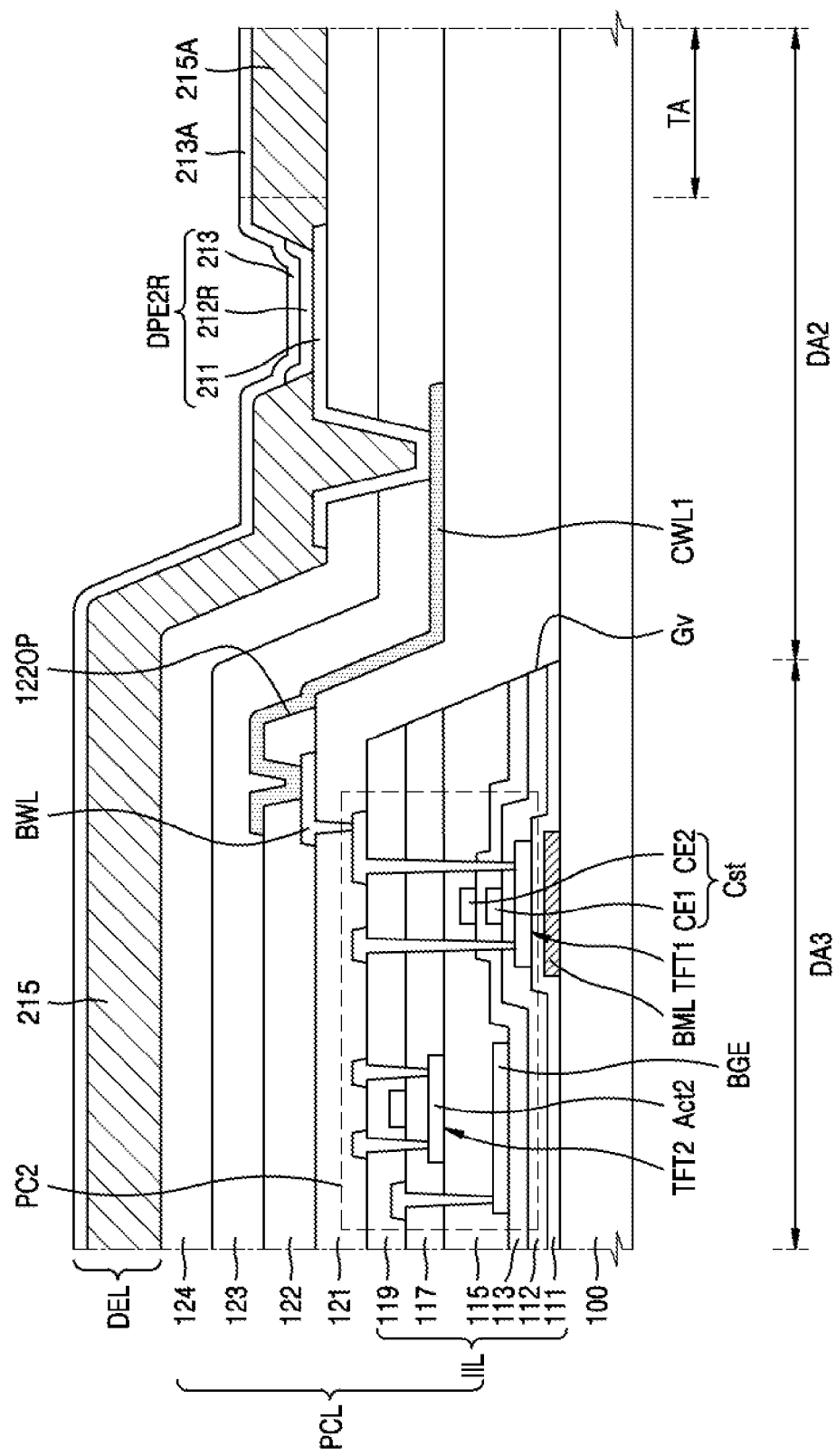
FIGS. 6A, 6B, and 6C are schematic cross-sectional views of a portion of the display apparatus according to an embodiment.
Figure 6B:
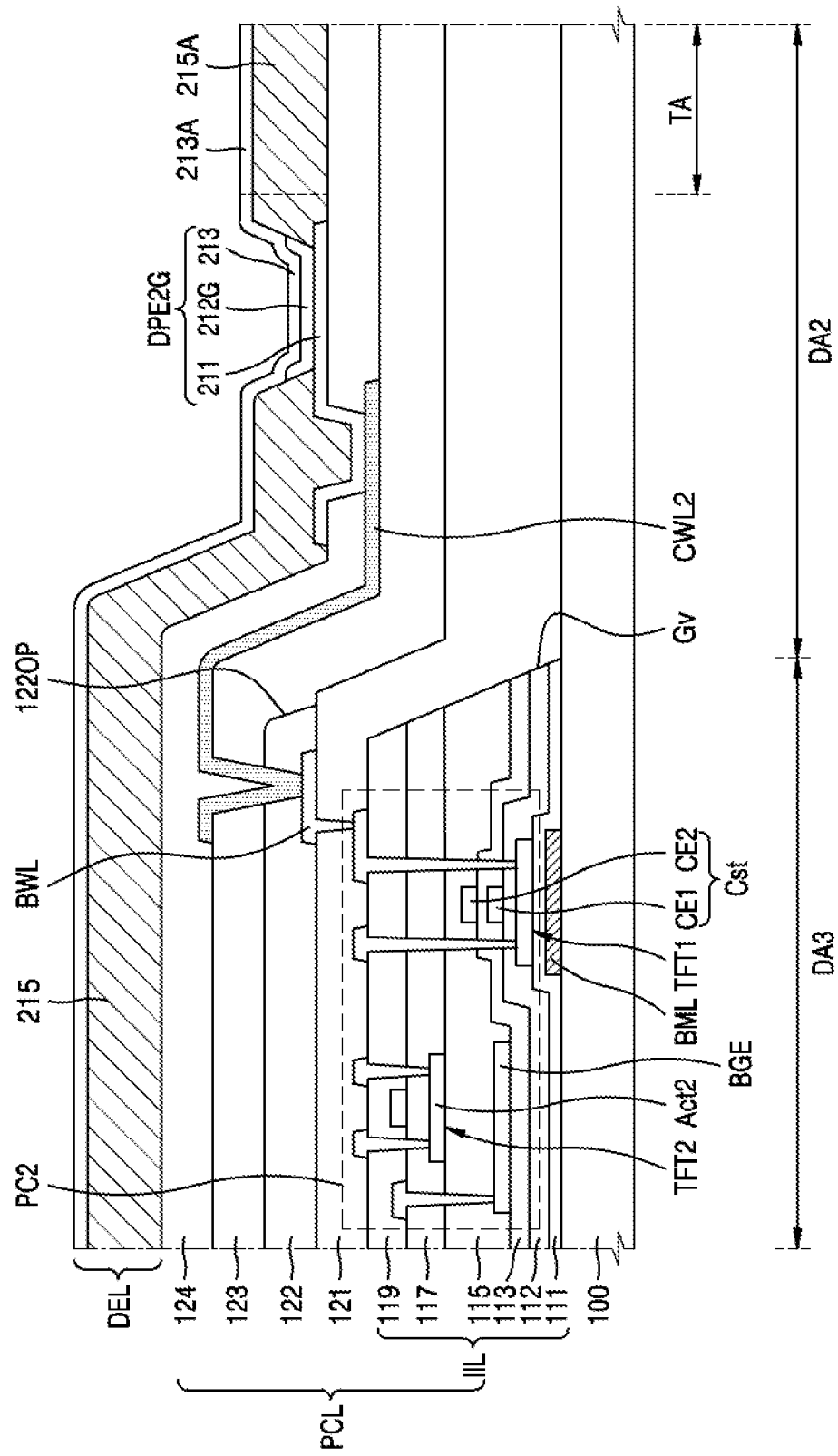
Figure 6C:
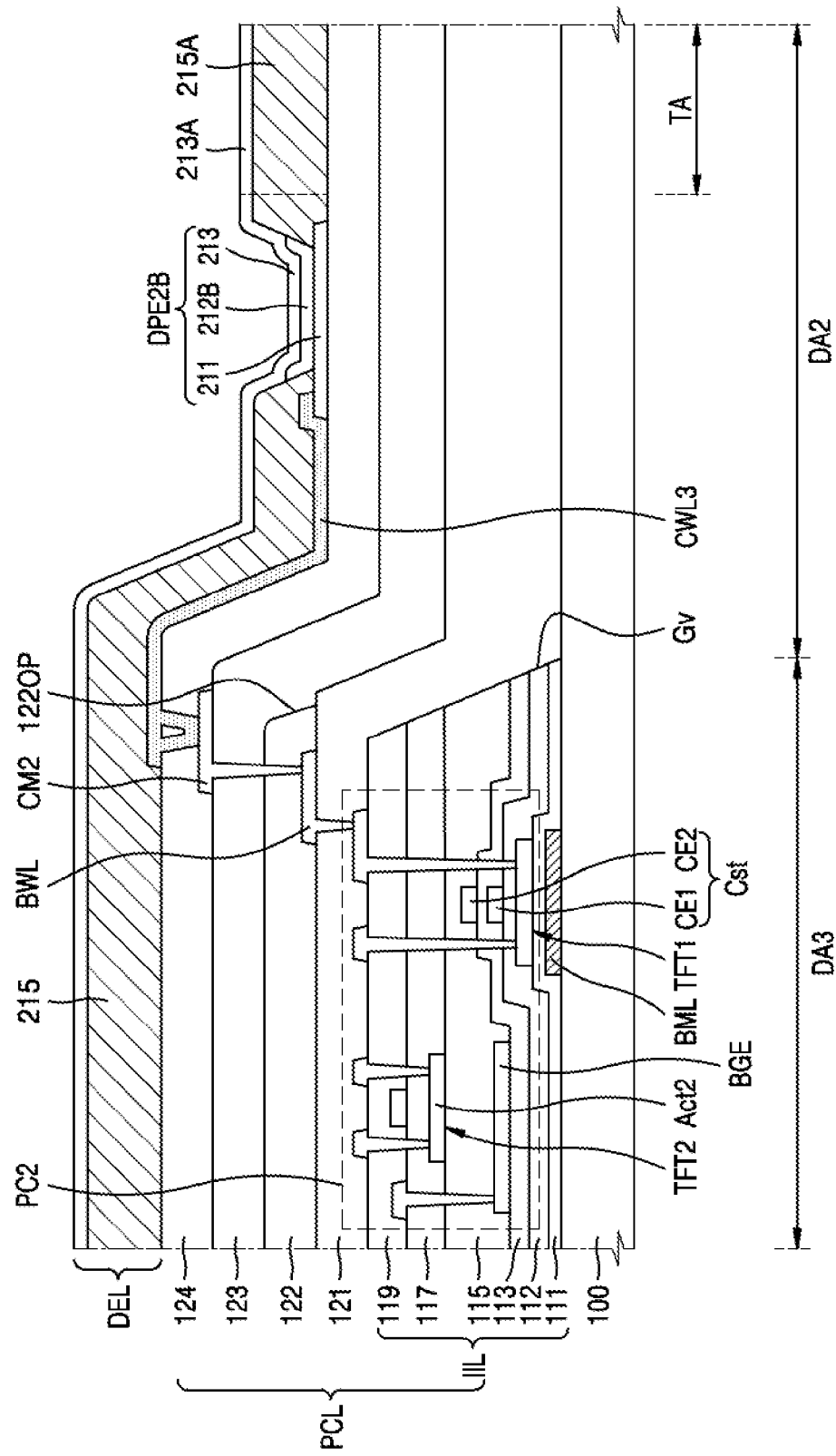

FIGS. 6A, 6B, and 6C are schematic cross-sectional views of a portion of the display apparatus according to an embodiment.

Referring to FIGS. 6A to 6C, the display panel DP may include the substrate 100, the pixel circuit layer PCL, and the display element layer DEL. The display element layer DEL may include, as the second display element, a red organic light-emitting diode DPE2R, a green organic light-emitting diode DPE2G, and a blue organic light-emitting diode DPE2B. The substrate 100 may include the second display area DA2 and the third display area DA3 adjacent to the second display area DA2.

The pixel circuit layer PCL may be disposed on the substrate 100. The pixel circuit layer PCL may include the second pixel circuit PC2, the inorganic insulating layer IIL, the first organic insulating layer 121, the second organic insulating layer 122, the third organic insulating layer 123, and the fourth organic insulating layer 124. In an embodiment, the inorganic insulating layer IIL may include the buffer layer 111, the first gate insulating layer 112, the second gate insulating layer 113, the first inorganic insulating layer 115, the second inorganic insulating layer 117, and the interlayer insulating layer 119.

The second sub-pixel circuit PC2 that drives each of the second display elements, may be arranged in the third display area DA3. In other words, the second sub-pixel circuits PC2 may not be arranged in the second display area DA2. The second sub-pixel circuit PC2 may include the first thin-film transistor TFT1, the second thin-film transistor TFT2, and the storage capacitor Cst.

In an embodiment, the inorganic insulating layer IIL may include a groove Gv or a hole overlapping the second display area DA2. The groove Gv may have a shape formed by removing a portion of the inorganic insulating layer IIL. As an example, the buffer layer 111, the first gate insulating layer 112, the second gate insulating layer 113, the first inorganic insulating layer 115, the second inorganic insulating layer 117, and the interlayer insulating layer 119 may each include an opening that overlaps the second display area DA2. The openings of the buffer layer 111, the first gate insulating layer 112, the second gate insulating layer 113, the first inorganic insulating layer 115, the second inorganic insulating layer 117, and the interlayer insulating layer 119, may be respectively formed by separate processes, or simultaneously formed by the same process. In the case where the openings of the buffer layer 111, the first gate insulating layer 112, the second gate insulating layer 113, the first inorganic insulating layer 115, the second inorganic insulating layer 117, and the interlayer insulating layer 119, may be formed by separate processes, the groove Gv may have a step difference shape such as a staircase.

The first organic insulating layer 121 may fill the groove Gv. As an example, a portion of the first organic insulating layer 121 may at least partially fill the groove Gv. A transmittance (for example, a light transmittance) of the first organic insulating layer 121 may be greater than a transmittance of the inorganic insulating layer IIL. Accordingly, a transmittance of the second display area DA2 may increase.

Though it is shown in FIGS. 6A to 6C that the inorganic insulating layer IIL may include the groove Gv, the inorganic insulating layer IIL may not include the groove Gv in an embodiment. For example, the buffer layer 111, the first gate insulating layer 112, the second gate insulating layer 113, the first inorganic insulating layer 115, the second inorganic insulating layer 117, and the interlayer insulating layer 119, may each be continuously arranged.

The connection line may be provided in plurality. The connection lines may be respectively electrically connected to the second sub-pixel circuits PC2. The connection lines may respectively electrically connect the second display elements to the second sub-pixel circuits PC2. In an embodiment, the connection line may include a first connection line CWL1, a second connection line CWL2, and a third connection line CWL3.

In an embodiment, the first connection line CWL1, the second connection line CWL2, and the third connection line CWL3 may each extend from the third display area DA3 to the second display area DA2. The first connection line CWL1, the second connection line CWL2, and the third connection line CWL3 may each include a transparent conductive oxide (TCO). The first connection line CWL1, the second connection line CWL2, and the third connection line CWL3 may each include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

In an embodiment, it is shown in FIGS. 6A and 6B that the first connection line CWL1, the second connection line CWL2, and the third connection line CWL3 respectively connected to a red organic light-emitting diode DPE2R, a green organic light-emitting diode DPE2G, and a blue organic light-emitting diode DPE2B, are respectively disposed on different layers. In an embodiment, the first connection line CWL1 may be disposed between the second organic insulating layer 122 and the display element layer DEL. The second connection line CWL2 may be disposed between the third organic insulating layer 123 and the display element layer DEL. The third connection line CWL3 may be disposed on a same layer as the pixel electrode 211. The third connection line CWL3 may be disposed on the fourth organic insulating layer 124, and one end or an end of the third connection line CWL3 may be provided to cover the edge of the pixel electrode 211. In an embodiment, though the first connection line CWL1, the second connection line CWL2, and the third connection line CWL3 may be arranged on a same layer, the first connection line CWL1, the case where the second connection line CWL2, and the third connection line CWL3 are respectively arranged on different layers, is described below.

Referring to FIGS. 6A to 6C, at least one of the second organic insulating layer 122 and the third organic insulating layer 123 may have an opening. In an embodiment, the second organic insulating layer 122 may include an opening 1220P that overlaps the second display area DA2.

Referring to FIG. 6A, the first connection line CWL1 may be disposed on the second organic insulating layer 122. As the first connection line CWL1 extends from the third display area DA3 to the second display area DA2, the first connection line CWL1 may overlap the groove Gv of the inorganic insulating layer IIL and the opening 1220P of the second organic insulating layer 122. The first connection line CWL1 may be disposed on the first organic insulating layer 121 in the opening 1220P of the second organic insulating layer 122.

The first connection line CWL1 may be electrically connected to the second sub-pixel circuit PC2 through a bridge line BWL disposed between the first organic insulating layer 121 and the second organic insulating layer 122. In an embodiment, the bridge line BWL may be electrically connected to the second sub-pixel circuit PC2 through a contact hole of the first organic insulating layer 121. The bridge line BWL may be electrically connected to the first connection line CWL1 through a contact hole of the second organic insulating layer 122.

In an embodiment, the second organic insulating layer 122, the third organic insulating layer 123, and the fourth organic insulating layer 124 may be disposed on the bridge line BWL. The first connection line CWL1 may be electrically connected to the red organic light-emitting diode DPE2R through a contact hole of the third organic insulating layer 123 and the fourth organic insulating layer 124. Accordingly, the red organic light-emitting diode DPE2R may be electrically connected to the second sub-pixel circuit PC2 and driven by the second sub-pixel circuit PC2.

Referring to FIG. 6B, the second connection line CWL2 may be disposed between the third organic insulating layer 123 and the display element layer DEL. In an embodiment, the second connection line CWL2 may be electrically connected to the second sub-pixel circuit PC2 through the bridge line BWL disposed between the first organic insulating layer 121 and the second organic insulating layer 122. In an embodiment, the bridge line BWL may be electrically connected to the second sub-pixel circuit PC2 through a contact hole of the first organic insulating layer 121. The second connection line CWL2 may be electrically connected to the bridge line BWL through a contact hole of the second organic insulating layer 122 and the third organic insulating layer 123.

The fourth organic insulating layer 124 may be disposed on the second connection line CWL2. The second connection line CWL2 may be electrically connected to the green organic light-emitting diode DPE2G through a contact hole of the fourth organic insulating layer 124. Accordingly, the green organic light-emitting diode DPE2G may be electrically connected to the second sub-pixel circuit PC2 and driven by the second sub-pixel circuit PC2.

Referring to FIG. 6C, the third connection line CWL3 may be disposed on a same layer as the pixel electrode 211. In an embodiment, the third connection line CWL3 may be disposed between the fourth organic insulating layer 124 and the first bank layer 215. In an embodiment, the third connection line CWL3 may be electrically connected to the second connection electrode CM2 disposed between the third organic insulating layer 123 and the fourth organic insulating layer 124. The second connection line CM2 may be electrically connected to the third connection line CWL3 through a contact hole of the fourth organic insulating layer 124. The second connection line CM2 may be electrically connected to the second sub-pixel circuit PC2 through the bridge line BWL disposed on the first organic insulating layer 121. The second connection electrode CM2 may be electrically connected to the bridge line BWL through a contact hole of the second organic insulating layer 122 and the third organic insulating layer 123. In an embodiment, the bridge line BWL may be electrically connected to the second sub-pixel circuit PC2 through a contact hole of the first organic insulating layer 121.

The third connection line CWL3 may be electrically connected to the blue organic light-emitting diode DPE2B. One end or an end of the third connection line CWL3 may be provided to cover the edge of the pixel electrode 211 of the blue organic light-emitting diode DPE2B. Accordingly, the blue organic light-emitting diode DPE2B may be electrically connected to the second sub-pixel circuit PC2 and driven by the second sub-pixel circuit PC2.

In an embodiment, at least one of the bridge line BWL and the second connection electrode CM2 may include a material having high conductivity. At least one of the bridge line BWL and the second connection electrode CM2 may include a conductive material including molybdenum (Mo), aluminum (Al), copper (Cu), and titanium (Ti) and include a single layer or a multi-layer including the above materials. At least one of the bridge line BWL and the second connection electrode CM2 may have a multi-layered structure of Ti/Al/Ti. In an embodiment, the bridge line BWL and the second connection electrode CM2 may include a same material or a similar material.

Though it is shown in FIGS. 6A to 6C that each sub-pixel circuit PC2 is electrically connected to a second display element corresponding thereto through one connection line, the disclosure is not limited thereto. As an example, though it is shown in FIG. 6A that the red organic light-emitting diode DPE2R is electrically connected to the second sub-pixel circuit PC2 through the first connection line CWL1, and the first connection line CWL1 contacts or directly contacts the pixel electrode 211 of the red organic light-emitting diode DPE2R, an intermediate layer, may be further disposed between the first connection line CWL1 and the pixel electrode 211 of the red organic light-emitting diode DPE2R in an embodiment, the intermediate layer being disposed on a same layer as at least one of the second connection line CWL2 and the third connection line CWL3.

The display element layer DEL may be disposed on the pixel circuit layer PCL. The display element layer DEL may include the first bank layer 215, the red organic light-emitting diode DPE2R, the green organic light-emitting diode DPE2G, and the blue organic light-emitting diode DPE2B. The red organic light-emitting diode DPE2R, the green organic light-emitting diode DPE2G, and the blue organic light-emitting diode DPE2B may each be disposed on the fourth organic insulating layer 124.

The first bank layer 215 may include a first portion 215A (refer to a region marked by dashed lines in the first bank layer 215 of FIG. 6A) that overlaps a portion of the second display area DA2. The first portion 215A may not overlap the pixel electrode 211. The first portion 215A may be a region apart from a first opening of the first bank layer 215 that exposes the pixel electrode 211. Though it is shown in FIGS. 6A to 6C that the first bank layer 215 may include the first portion 215A and continuously extends, the first bank layer 215 may include a second opening that corresponds to the first portion 215A, in an embodiment. In other words, the first portion 215A may be removed. In the case where the first bank layer 215 may include the second opening that corresponds to the first portion 215A, a transmittance (for example, a light transmittance) of the display panel DP in the second display area DA2 may be improved. A region of the second display area DA2 that overlaps the first portion 215A, may correspond to the transmissive area TA.

The red organic light-emitting diode DPE2R, the green organic light-emitting diode DPE2G, and the blue organic light-emitting diode DPE2B may each be electrically connected to the second sub-pixel circuit PC2. The red organic light-emitting diode DPE2R, the green organic light-emitting diode DPE2G, and the blue organic light-emitting diode DPE2B may each include the pixel electrode 211 and the opposite electrode 213.

In an embodiment, the red organic light-emitting diode DPE2R may be disposed between the pixel electrode 211 and the opposite electrode 213, and may include a red emission layer 212R emitting red light. The green organic light-emitting diode DPE2G may be disposed between the pixel electrode 211 and the opposite electrode 213, and may include a green emission layer 212G emitting green light. The blue organic light-emitting diode DPE2B may be disposed between the pixel electrode 211 and the opposite electrode 213, and may include a blue emission layer 212B emitting blue light.

The opposite electrode 213 may include a second portion 213A (refer to a region marked by dashed lines in the opposite electrode 213 of FIG. 6A) that overlaps a portion of the second display area DA2. The second portion 213A may not overlap the pixel electrode 211. Though it is shown in FIGS. 6A to 6C that the opposite electrode 213 continuously extends in the second portion 213A, the opposite electrode 213 may have an opening corresponding to the second portion 213A in an embodiment. In other words, the second portion 213A may be removed. In the case where the opposite electrode 213 may include an opening that corresponds to the second portion 213A, a transmittance (for example, a light transmittance) of the display panel DP may be improved in the second display area DA2. A region of the second display area DA2 that overlaps the second portion 213A, may correspond to the transmissive area TA.

Figure 7:
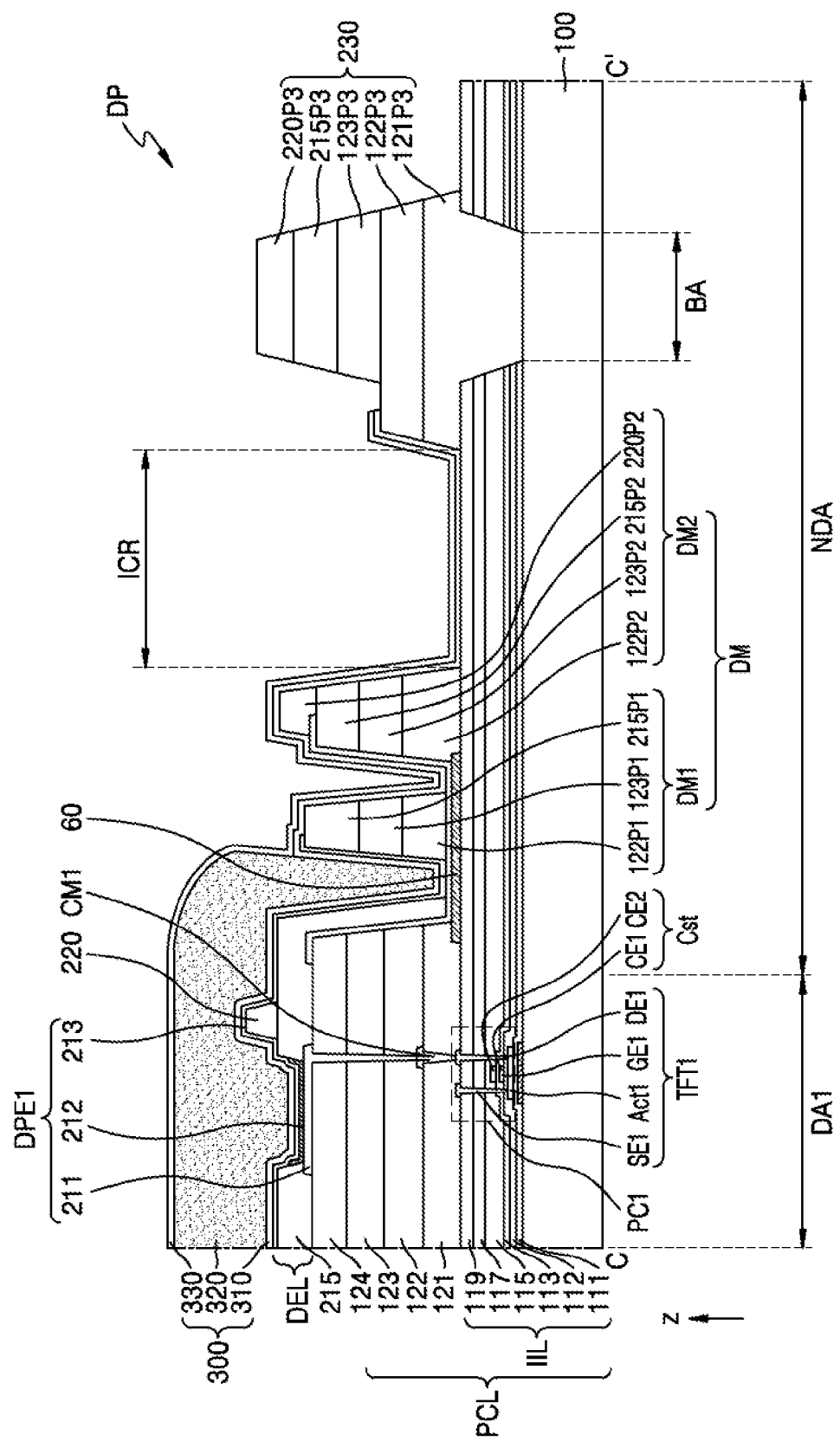
FIG. 7 is a schematic cross-sectional view of a portion of a display apparatus, taken along line C-C' of FIG. 3B, according to an embodiment.

FIG. 7 is a schematic cross-sectional view of a portion of a display apparatus, taken along line C-C' of FIG. 3B, according to an embodiment.

Referring to FIG. 7, the display panel DP may include the display area DA (see FIG. 3B) and the non-display area NDA. The display area DA may include the first display area DA1. The structure of the first display area DA1 is the same as that described with reference to FIG.

The display panel DP may include the substrate 100, the pixel circuit layer PCL, and the display element layer DEL. The pixel circuit layer PCL may be disposed on the substrate 100. The pixel circuit layer PCL may include the first pixel circuit PC1, the first connection electrode CM1, the inorganic insulating layer IIL, the first organic insulating layer 121, the second organic insulating layer 122, the third organic insulating layer 123, and the fourth organic insulating layer 124.

The first sub-pixel circuit PC1 may include the first thin-film transistor TFT1 and the storage capacitor Cst. The first thin-film transistor TFT1 may include the first semiconductor layer Act1, the first gate electrode GE1, the first source electrode SE1, and the first drain electrode DE1. The storage capacitor Cst may include the first capacitor electrode CE1 and the second capacitor electrode CE2.

The display element layer DEL may be disposed on the pixel circuit layer PCL. The display element layer DEL may include the first display element DPE1. The first display element DPE1 is an organic light-emitting diode and may include the pixel electrode 211, the emission layer 212, and the opposite electrode 213. The first display element DPE1 may be disposed on the fourth organic insulating layer 124.

A bank layer 215 may be disposed on the pixel electrode 211. A spacer 220 may be arranged on the first bank layer 215. The spacer 220 may include an organic insulating material such as polyimide. For example, the spacer may include an inorganic insulating material such as silicon oxide, silicon nitride, and silicon oxynitride, or include an organic insulating material and an inorganic insulating material. In an embodiment, the spacer 220 may include a same material or a similar material as a material of the bank layer 215. The first bank layer 215 and the spacer 220 may be simultaneously formed during a mask process that uses a half-tone mask. In an embodiment, the spacer 220 may include a different material from a material of the first bank layer 215.

The display element layer DEL and the pixel circuit layer PCL may be covered by the thin-film encapsulation layer 300. The thin-film encapsulation layer 300 may include the first inorganic encapsulation layer 310, the second inorganic encapsulation layer 330, and the organic encapsulation layer 320 therebetween.

The first and second inorganic encapsulation layers 310 and 330 may each include at least one inorganic insulating material. The inorganic insulating material may include aluminum oxide, titanium oxide, tantalum oxide, hafnium oxide, zinc oxide, silicon oxide, silicon nitride, and/or silicon oxynitride. The organic encapsulation layer 320 may include a polymer-based material. The polymer-based material may include an acryl-based resin, an epoxy-based resin, polyimide, and polyethylene. As an example, the organic encapsulation layer 320 may include an acrylic resin, such as polymethyl methacrylate or polyacrylic acid. The organic encapsulation layer 320 may be formed by hardening a monomer or coating a polymer.

The thin-film encapsulation layer 300 may cover the display area DA entirely, extend toward the non-display area NDA, and be arranged to cover a portion of the non-display area NDA. The thin-film encapsulation layer 300 may extend to the outer region of the driving voltage supply line 60.

In an embodiment, the touchscreen layer TSL and the optical functional layer OFL described with reference to FIG. 2A, may be further disposed on the thin-film encapsulation layer 300.

The dam DM may be disposed in the non-display area NDA adjacent to the display area DA. The dam DM may be arranged to surround the display area DA as described with reference to FIG. 3B. Though it is shown in FIG. 7 that the dam DM may include a first dam DM1 and a second dam DM2 outside the first dam DM1, the dam DM may include only the first dam DM1 or further include a partition wall adjacent to the second dam DM2 in an embodiment.

A valley may be provided between the first dam DM1 and the display area DA, and between the first dam DM1 and the second dam DM2. The first dam DM1, the second dam DM2, and the valley structure formed through this, may prevent the organic encapsulation layer 320 of the thin-film encapsulation layer 300 from overflowing toward the edge of the substrate 100. The first dam DM1, the second dam DM2, and the valley structure formed through this, may prevent the edge tail of the organic encapsulation layer 320 from being formed.

The organic encapsulation layer 320 may contact the inner surface of the first dam DM1 facing the display area DA. In case that the organic encapsulation layer 320 contacts the inner surface of the first dam DM1, it may be understood that the first inorganic encapsulation layer 320 is located between the organic encapsulation layer 320 and the first dam DM1, and the organic encapsulation layer 320 contacts or directly contacts the first inorganic encapsulation layer 310. The first inorganic encapsulation layer 310 and the second inorganic encapsulation layer 330 may be disposed on the first dam DM1 and the second dam DM2, and may extend toward the edge of the substrate 100.

The first dam DM1 may include a portion 122P1 of the second organic insulating layer 122, a portion 123P1 of the third organic insulating layer 123, and a portion 215P1 of the first bank layer 215. The second dam DM2 may include a portion 122P2 of the second organic insulating layer 122, a portion 123P2 of the third organic insulating layer 123, a portion 215P2 of the first bank layer 215, and a portion 220P2 of the spacer 220. In an embodiment, the first dam DM1 and the second dam DM2 may each further include a portion of other layers, or some or a number of the above-described layers may be omitted.

The driving voltage supply line 60 may be arranged to at least partially overlap the dam DM. As an example, the driving voltage supply line 60 may be arranged to overlap the first dam DM1 and the second dam DM2. In an embodiment, the driving voltage supply line 60 may include a same material as a material of the first source electrode SE1 and the first drain electrode DE1 of the first thin-film transistor TFT1, or the first connection electrode CM1. In an embodiment, the driving voltage supply line 60 may be disposed on a same layer as the common voltage supply line 70 (see FIG. 3B), and include a same material as a material of the common voltage supply line 70. As an example, the driving voltage supply line 60 may include a conductive material including molybdenum (Mo), aluminum (Al), copper (Cu), and titanium (Ti) and have a single-layered structure or a multi-layered structure including the above materials. In an embodiment, the driving voltage supply line 60 may have a multi-layered structure of Ti/Al/Ti.

As described above with reference to FIG. 3B, the non-display area NDA may include the bent area BA at least in part. The bent area BA may be apart from the first dam DM1 and the second dam DM2. In an embodiment, the inorganic insulating layer IIL may include an opening corresponding to the bent area BA. For example, the inorganic insulating layer IIL arranged to correspond to the bent area BA, may be removed from the bent area BA. Though it is shown in FIG. 7 that the inorganic insulating layer IIL corresponding to the bent area BA is removed entirely, a portion or all of the buffer layer 111 may remain without being removed in an embodiment. Because the inorganic insulating layer IIL located in the bent area BA, is partially or entirely removed, cracks may be prevented from propagating through the inorganic insulating layer IIL while the substrate 100 is bent.

In an embodiment, a bank layer 230 may be arranged in the non-display area NDA. The bank 230 may be apart from the first dam DM1 and the second dam DM2. The bank 230 supports masks used while the emission layer 212 and/or the opposite electrode 213 of the organic light-emitting diode included as the display element, are formed during a process of manufacturing the display panel DP. The bank 230 may prevent or reduce lower elements from being damaged by the masks.

In an embodiment, the bank 230 may be arranged to at least partially overlap the bent area BA. Because, in case that an inorganic layer is located in the bent area BA, cracks may occur in the inorganic layer, the bank 230 may generally include an organic insulating material. In an embodiment, the bank 230 may include a portion 121P3 of the first organic insulating layer 121, a portion 122P3 of the second organic insulating layer 122, a portion 123P3 of the third organic insulating layer 123, a portion 215P3 of the first bank layer 215, and a portion 220P3 of the spacer 220. In an embodiment, the bank 230 may further include a portion of other layers, or some or a number of the above-described layers may be omitted. In an embodiment, the portion 121P3 of the first organic insulating layer 121 and the portion 122P3 of the second organic insulating layer 122 that constitute the bank 230, may further extend in a direction (for example, a −y direction) from the bent area BA to the display area DA, than the portion 123P3 of the third organic insulating layer 123, the portion 215P3 of the first bank layer 215, and the portion 220P3 of the spacer 220.

The first inorganic encapsulation layer 310 and the second inorganic encapsulation layer 330 of the thin-film encapsulation layer 300, may extend toward the bank 230. In an embodiment, the ends of the first inorganic encapsulation layer 310 and the second inorganic encapsulation layer 330, may be located on the bank 230. In an embodiment, the ends of the first inorganic encapsulation layer 310 and the second inorganic encapsulation layer 330 may be located between the second dam DM2 and the bank 230.

In an embodiment, the non-display area NDA may include a first region ICR. The first region ICR may be located between the second dam DM2 and the bank 230. There may be only inorganic insulating materials in the first region ICR. In case that there may be only the inorganic insulating materials in the first region ICR, it may mean that the organic insulating materials are not arranged in the first region ICR. As an example, an inorganic insulating layer and/or a conductive material layer may be arranged in the first region ICR. The first region ICR may include a region where the inorganic insulating layer IIL contacts the first inorganic encapsulation layer 310. Because the first inorganic encapsulation layer 310 may include a region in which the first inorganic encapsulation layer 310 contacts or directly contacts the second inorganic encapsulation layer 330 and the other inorganic insulating layer IIL thereunder, adhesive force improves, and thus, penetration of external moisture and oxygen may be more effectively prevented or reduced.

Figure 8:
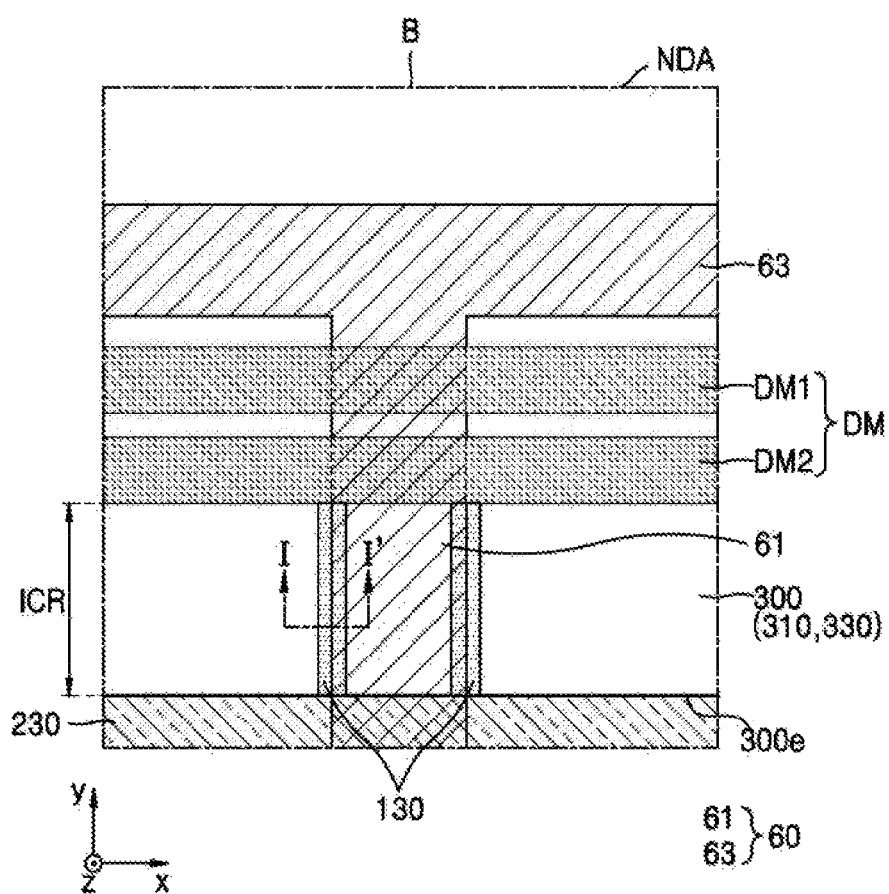
FIG. 8 is a schematic enlarged plan view of a portion of a display apparatus, showing a region B of FIG. 3B, according to an embodiment.

FIG. 8 is a schematic enlarged cross-sectional view of a portion of the display apparatus, showing a region B of FIG. 3B according to an embodiment.

Referring to FIGS. 3B and 8, the driving voltage supply line 60 may be arranged in the non-display area NDA of the display panel DP. The dam DM and the bank 230 may be arranged in the non-display area NDA of the display panel DP.

The dam DM may include the first dam DM1 and the second dam DM2. The first dam DM1 may be arranged to surround the display area DA, and the second dam DM2 may be arranged to surround the first dam DM1 in the outside of the first dam DM1. Because the first dam DM1 is arranged along the circumference of the display area DA, it may be understood that the second dam DM2 is arranged also along the circumference of the display area DA. The first dam DM1 may be apart from the second dam DM2.

A portion of the driving voltage supply line 60 may be located closer to the display area DA than the first dam DM1. It is shown in FIG. 8 that the third driving voltage supply line 63 is disposed inside the first dam DM1 and is located closer to the display area DA. A portion of the driving voltage supply line 60, for example, the first driving voltage supply line 61 may extend in a direction crossing the first dam DM1 and the second dam DM2, and overlap the first dam DM1 and the second dam DM2. The first driving voltage supply line 61 extends from the third driving voltage supply line 63. The first driving voltage supply line 61 is integrally connected to the third driving voltage supply line 63.

The first driving voltage supply line 61 may extend in the second direction (for example, the y direction) facing the edge of the substrate 100. The first driving voltage supply line 61 may overlap the first region ICR. In other words, the first driving voltage supply line 61 may pass across the first region ICR.

The bank 230 may be further located outside the second dam DM2. The bank 230 may surround at least a portion of the second dam DM2. The bank 230 may overlap a portion of the driving voltage supply line 60. For example, the first driving voltage supply line 61 may overlap the bank 230.

According to an embodiment, a cover layer 130 may be disposed on the first driving voltage supply line 61. The cover layer 130 may be located in the first region ICR. The cover layer 130 may be arranged to contact or directly contact the first driving voltage supply line 61. By way of example, the cover layer 130 may be arranged to cover at least one edge of the first driving voltage supply line 61. In an embodiment, the cover layer 130 may be disposed to cover two opposite edges of the first driving voltage supply line 61. The cover layer 130 may continuously cover a portion of the upper surface and a portion of the lateral surface of the first driving voltage supply line 61, and a portion of the upper surface of the inorganic insulating layer IIL disposed under or directly under or below the first driving voltage supply line 61.

The cover layer 130 may include at least one transparent conductive material layer. In an embodiment, the cover layer 130 may include at least one layer or a layer including a transparent conductive material such as indium tin oxide (ITO), indium zinc oxide (IZO), zinc oxide (ZnO), indium oxide ($In_2O_3$), indium gallium oxide (IGO), or aluminum zinc oxide (AZO). As an example, the cover layer 130 may have a structure in which three transparent conductive material layers may be sequentially stacked each other.

The inorganic encapsulation layer of the thin-film encapsulation layer 300, for example, the first and second inorganic encapsulation layers 310 and 330 may extend to the non-display area NDA. The first and second inorganic encapsulation layers 310 and 330 may be disposed on the first driving voltage supply line 61, the third driving voltage supply line 63, the first dam DM1, and the second dam DM2 in the non-display area NDA, and may overlap the first driving voltage supply line 61, the third driving voltage supply line 63, the first dam DM1, and the second dam DM2. In an embodiment, the edge 300e of the thin film encapsulation layer 300 may be disposed on the edge of the bank 230. Alternatively, the edge 300e of the thin film encapsulation layer 300 may be disposed on the bank 230.

The cover layer 130 may be located between the second dam DM2 and the bank 230. The first and second inorganic encapsulation layers 310 and 330 may be disposed on the cover layer 130 in the first region ICR. By way of example, the first inorganic encapsulation layer 310 of the thin-film encapsulation layer 300 may extend on the edge of the first driving voltage supply line 61 covered by the cover layer 130.

According to an embodiment, because the cover layer 130 covering the edge of the first driving voltage supply line 61 is provided, the edge of the first driving voltage supply line 61 may not be exposed or damaged during a subsequent mask process before the thin-film encapsulation layer 300 is formed, and occurrence of moisture transmission to the inside of the dam DM through the edge of the first driving voltage supply line 61, may be reduced.

In an embodiment, two opposite edges of the first driving voltage supply line 61 covered by the cover layer 130, may have a straight line shape in plan view. In the case where the edges of the first driving voltage supply line 61 have a straight line shape in plan view, step coverage with which the cover layer 130 covers the edges, may improve.

Figure 9:
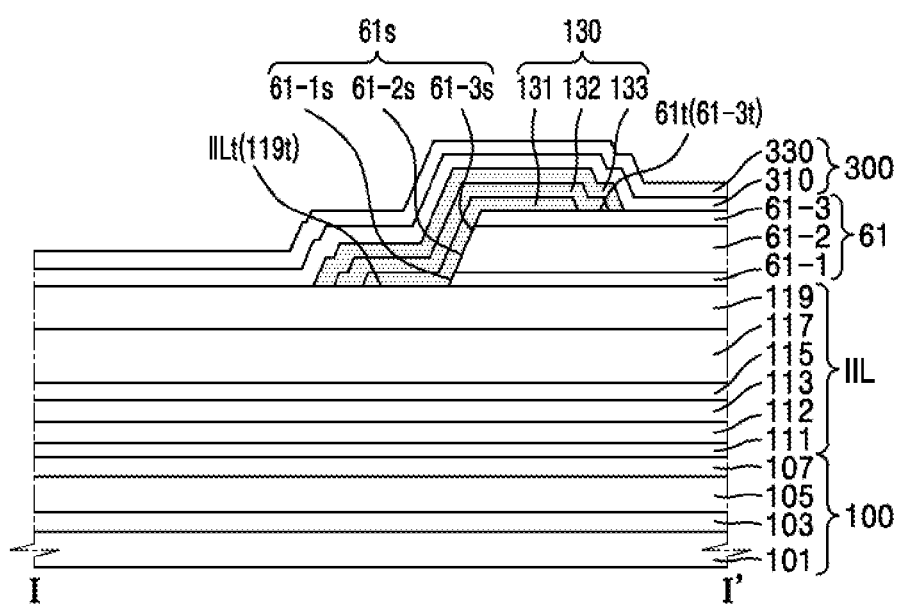
FIG. 9 is a schematic cross-sectional view of a portion of a display apparatus, taken along line I-I' of FIG. 8, according to an embodiment.

FIG. 9 is a schematic cross-sectional view of a portion of the display apparatus, taken along line I-I' of FIG. 8, according to an embodiment.

Referring to FIG. 9, the substrate 100 may be arranged in the first region ICR. In an embodiment, the substrate 100 may include the first base layer 101, the first barrier layer 103, the second base layer 105, and the second barrier layer 107.

The inorganic insulating layer IIL may be disposed on the substrate 100. The inorganic insulating layer IIL may sequentially include the buffer layer 111, the first gate insulating layer 112, the second gate insulating layer 113, the first inorganic insulating layer 115, the second inorganic insulating layer 117, and the interlayer insulating layer 119.

The driving voltage supply line 60, for example, the first driving voltage supply line 61 may be disposed between the inorganic insulating layer IIL and the thin-film encapsulation layer 300 as shown in FIG. 9.

In an embodiment, the first driving voltage supply line 61 may include a first layer 61-1, a second layer 61-2, and a third layer 61-3 that may be sequentially stacked each other. In an embodiment, the first to third layers 61-1, 61-2, and 61-3 may each include a conductive material including molybdenum (Mo), aluminum (Al), copper (Cu), titanium (Ti), and the like within the spirit and the scope of the disclosure. In an embodiment, the first layer 61-1 may include a same material or a similar material as a material of the third layer 61-3. As an example, the first layer 61-1 and the third layer 61-3 may include titanium (Ti). In an embodiment, the second layer 61-2 may include aluminum (Al).

In an embodiment, the cover layer 130 may continuously cover a lateral surface 61s of the first driving voltage supply line 61, at least a portion of an upper surface 61t of the first driving voltage supply line 61, and at least a portion of an upper surface IILt of the inorganic insulating layer IIL disposed under or directly under or below the first driving voltage supply line 61. By way of example, the cover layer 130 may cover at least a portion of a lateral surface 61-1s of the first layer 61-1, a lateral surface 61-2s of the second layer 61-2, a lateral surface 61-3s of the third layer 61-3, an upper surface 61-3t of the third layer 61-3, and at least a portion of an upper surface 119t of the interlayer insulating layer 119. The cover layer 130 may extend to cover the upper surface 61t and lateral surface 61s of the first driving voltage supply line 61, and the upper surface of the inorganic insulating layer IIL. As an example, the cover layer 130 may continuously cover the upper surface 61t and lateral surface 61s of the first driving voltage supply line 61, and the upper surface of the inorganic insulating layer IIL. The cover layer 130 may contact or directly contact the upper surface 61t and lateral surface 61s of the first driving voltage supply line 61, and the upper surface of the inorganic insulating layer IIL. The lateral surface 61s of the first driving voltage supply line 61 corresponds to the edge of the first driving voltage supply line 61 described with reference to FIG. 8.

In the case where the lateral surface 61s of the first driving voltage supply line 61 is exposed during a subsequent mask process, an undercut may occur in the lateral surface 61-2s of the second layer 61-2, and a protruding tip structure may be relatively formed on the lateral surface 61-3s of the third layer 61-3. Due to this, a gap may occur in the lateral surface 61s of the first driving voltage supply line 61, and the gap that occurs may serve as a movement path of external moisture and oxygen. The tip structure of the third layer 61-3 may form a moisture transmission path by damaging the thin-film encapsulation layer 300 thereon.

According to an embodiment, because the cover layer 130 covers at least a portion of the lateral surface 61-1s of the first layer 61-1, the lateral surface 61-2s of the second layer 61-2, the lateral surface 61-3s of the third layer 61-3, and the upper surface 61-3t of the third layer 61-3, occurrence of the undercut in the lateral surface 61-2s of the second layer 61-2 or forming of the protruding tip structure in the third layer 61-3 may be prevented or reduced. The organic light-emitting diode arranged in the display area DA may be protected from external moisture and oxygen.

In an embodiment, the lateral surface 61s of the first driving voltage supply line 61 may include an inclination surface tapered in a forward direction. The having the inclination surface tapered in the forward direction, may mean that the lateral surface 61s of the first driving voltage supply line 61 does not have an undercut structure or a protruding structure but has a shape of a gentle slope.

In an embodiment, the cover layer 130 may include at least one transparent conductive material layer. In an embodiment, the cover layer 130 may include a first transparent conductive material layer 131, a second transparent conductive material layer 132, and a third transparent conductive material layer 133 that may be sequentially stacked each other. In an embodiment, one of the first transparent conductive material layer 131, the second transparent conductive material layer 132, and the third transparent conductive material layer 133 of the cover layer 130, may be omitted. In an embodiment, in the case where the cover layer 130 may include the first transparent conductive material layer 131, the second transparent conductive material layer 132, and the third transparent conductive material layer 133 that may be sequentially stacked each other, step coverage covering the first driving voltage supply line 61 may be excellent.

In an embodiment, the first to third transparent conductive material layers 131, 132, and 133 may each include at least one of indium tin oxide (ITO), indium zinc oxide (IZO), zinc oxide (ZnO), indium oxide ($In_2O_3$), indium gallium oxide (IGO), and aluminum zinc oxide (AZO).

In an embodiment, at least one transparent conductive material layer of the cover layer 130 may include a same material as a material of at least one of the first connection line CWL1 (see FIG. 6A), the second connection line CWL2 (see FIG. 6B), and the third connection line CWL3 (see FIG. 6C) described above with reference to FIGS. 6A to 6C. In an embodiment, the first transparent conductive material layer 131 may include a same material as a material of the first connection line CWL1 and be formed during a same process. In an embodiment, the second transparent conductive material layer 132 may include a same material as a material of the second connection line CWL2 and be formed during a same process. In an embodiment, the third transparent conductive material layer 133 may include a same material as a material of the third connection line CWL3 and be formed during a same process.

According to an embodiment, because the first to third transparent conductive material layers 131, 132, and 133 are simultaneously formed during a process of forming the first to third connection lines CWL1, CWL2, and CWL3 (see FIGS. 6A to 6C), the cover layer 130 that effectively covers the edge of the first driving voltage supply line 61 may be formed even without adding a separate process. Accordingly, an economic advantage in an aspect of a process is provided.

In an embodiment, the thin-film encapsulation layer 300 may be disposed on the cover layer 130 and the interlayer insulating layer 119. By way of example, the first inorganic encapsulation layer 310 may be disposed on the cover layer 130 and the interlayer insulating layer 119. The first inorganic encapsulation layer 310 may be disposed on or directly disposed on the cover layer 130 and the interlayer insulating layer 119. The first inorganic encapsulation layer 310 may cover the upper surface of the first driving voltage supply line 61, the upper surface of the cover layer 130, and the upper surface of the inorganic insulating layer IIL. The first inorganic encapsulation layer 310 may contact or directly contact the upper surface 61t of the first driving voltage supply line 61, the upper surface of the cover layer 130, and the upper surface IILt of the inorganic insulating layer IIL.

In an embodiment, the second inorganic encapsulation layer 330 may be disposed on the first inorganic encapsulation layer 310. The second inorganic encapsulation layer 330 may be disposed on or directly disposed on the first inorganic encapsulation layer 310. Because the first inorganic encapsulation layer 310 is disposed on or directly disposed on the cover layer 130 and the interlayer insulating layer 119, and the second inorganic encapsulation layer 330 is disposed on or directly disposed on the first inorganic encapsulation layer 310, adhesive force of the thin-film encapsulation layer 300 improves, and thus, penetration of external moisture and oxygen may be more effectively prevented or reduced.

Though description is made to the first driving voltage supply line 61 and the neighboring structure thereof with reference to FIGS. 8 and 9, the disclosure is not limited thereto. Like the first driving voltage supply line 61, the second driving voltage supply line 62, the first common voltage supply line 71, and the second common voltage supply line 73 extending in the second direction (the y direction), may each have substantially the same structure as the structure described with reference to FIGS. 8 and 9. As an example, the edge of the second driving voltage supply line 62, the first common voltage supply line 71, and the second common voltage supply line 73 overlapping the first region ICR, may each have a straight line shape in plan view, and the cover layer 130 may be disposed on the edge of the second driving voltage supply line 62, the first common voltage supply line 71, and the second common voltage supply line 73.

According to embodiments, because the edge of a portion of the power supply line is covered by at least one transparent conductive material layer, a moisture transmission path may be prevented from being formed along the edge of the power supply line, and thus, the display apparatus with an improved reliability may be implemented. However, the scope of the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope and as defined by the following claims.

What is claimed is:

1. A display apparatus comprising:
a display area and a non-display area adjacent to the display area;
an inorganic insulating layer disposed in the display area and the non-display area;
display elements disposed in the display area;
a thin-film encapsulation layer disposed on the display elements and including:
a first inorganic encapsulation layer;
a second inorganic encapsulation layer; and
an organic encapsulation layer disposed between the first inorganic encapsulation layer and the second inorganic encapsulation layer;
a dam disposed in the non-display area and surrounding the display area; and
a power supply line disposed on the inorganic insulating layer in the non-display area, wherein
a portion of the power supply line intersects the dam,
an edge of the portion of the power supply line is covered by at least one transparent conductive material layer,
the first inorganic encapsulation layer extends to the non-display area, and
a portion of the first inorganic encapsulation layer is disposed on the portion of the power supply line covered by the at least one transparent conductive material layer.

2. The display apparatus of claim 1, wherein the edge of the portion of the power supply line is covered by the at least one transparent conductive material layer, between the dam and an edge of a substrate.

3. The display apparatus of claim 1, wherein the power supply line has a triple-layered structure including:
a first layer;
a third layer; and
a second layer, wherein
the first layer and the third layer include a same material, and
the second layer is disposed between the first layer and the third layer.

4. The display apparatus of claim 3, wherein
the first layer and the third layer of the power supply line each include titanium, and
the second layer includes aluminum.

5. The display apparatus of claim 1, wherein
the display area includes a first display area and a second display area at least partially surrounded by the first display area,
the display apparatus further comprises:
first display elements disposed in the first display area;
second display elements disposed in the second display area;
second sub-pixel circuits respectively electrically connected to the second display elements; and
connection lines respectively electrically connecting the second display elements to the second sub-pixel circuits, and
the second sub-pixel circuits are disposed between the first display area and the second display area, or in the non-display area.

6. The display apparatus of claim 5, wherein
the connection lines include:
a first connection line;
a second connection line; and
a third connection line respectively disposed on different layers, and
the at least one transparent conductive material layer includes:
a first transparent conductive material layer;
a second transparent conductive material layer; and
a third transparent conductive material layer, the second transparent conductive material layer disposed on the first transparent conductive material layer, and the third transparent conductive material layer disposed on the second transparent conductive material layer.

7. The display apparatus of claim 6, wherein
the first connection line and the first transparent conductive material layer include a same material,
the second connection line and the second transparent conductive material layer include a same, and
the third connection line and the third transparent conductive material layer include a same material.

8. The display apparatus of claim 1, wherein the edge of the portion of the power supply line has a substantially straight line shape in plan view.

9. The display apparatus of claim 1, wherein the at least one transparent conductive material layer continuously covers an upper surface of the portion of the power supply line, a lateral surface corresponding to the edge of the portion of the power supply line, and an upper surface of the inorganic insulating layer disposed below the portion of the power supply line.

10. The display apparatus of claim 9, wherein the at least one transparent conductive material layer directly contacts the upper surface of the portion of the power supply line, the lateral surface corresponding to the edge of the portion of the power supply line, and the upper surface of the inorganic insulating layer disposed below the portion of the power supply line.

11. A display apparatus comprising:
a display area, the display area including:
a first display area; and
a second display area at least partially surrounded by the first display area;
a non-display area adjacent to the display area;
an inorganic insulating layer disposed in the display area and the non-display area;
first display elements disposed in the first display area;
second display elements disposed in the second display area;
second sub-pixel circuits disposed between the first display area and the second display area, or in the non-display area, and respectively electrically connected to the second display elements;
connection lines respectively electrically connecting the second display elements to the second sub-pixel circuits;
a thin-film encapsulation layer disposed on the first display elements and the second display elements, and including:
a first inorganic encapsulation layer;
a second inorganic encapsulation layer, and
an organic encapsulation layer disposed between the first inorganic encapsulation layer and the second inorganic encapsulation layer;
a dam disposed in the non-display area and surrounding the display area; and
a power supply line disposed on the inorganic insulating layer in the non-display area, wherein
a portion of the power supply line intersects the dam, an edge of the portion of the power supply line is covered by at least one transparent conductive material layer, the first inorganic encapsulation layer extends to the non-display area, and a portion of the first inorganic encapsulation layer is disposed on the portion of the power supply line covered by the at least one transparent conductive material layer.

12. The display apparatus of claim 11, wherein the at least one transparent conductive material layer includes:

a first transparent conductive material layer;

a second transparent conductive material layer; and a third transparent conductive material layer, the second transparent conductive material layer disposed on the first transparent conductive material layer, and the third transparent conductive material layer disposed on the second transparent conductive material layer.

13. The display apparatus of claim 12, wherein the connection lines include a first connection line, a second connection line, and a third connection line respectively disposed on different layers.

14. The display apparatus of claim 13, wherein the first connection line and the first transparent conductive material layer include a same material, the second connection line and the second transparent conductive material layer include a same material, and the third connection line and the third transparent conductive material layer include a same material.

15. The display apparatus of claim 11, wherein the edge of the portion of the power supply line is covered by the at least one transparent conductive material layer, between the dam and an edge of a substrate.

16. The display apparatus of claim 11, wherein the at least one transparent conductive material layer continuously covers an upper surface of the portion of the power supply line, a lateral surface corresponding to the edge of the portion of the power supply line, and an upper surface of the inorganic insulating layer disposed below the portion of the power supply line.

17. The display apparatus of claim 11, wherein the edge of the portion of the power supply line has a substantially straight line shape in plan view.

18. An electronic apparatus comprising:

a display apparatus including a display area, the display area including:

a first display area; and a second display area at least partially surrounded by the first display area;

a non-display area adjacent to the display area; and a component disposed below the display apparatus and corresponding to the second display area, wherein the display apparatus includes:

an inorganic insulating layer disposed in the display area and the non-display area;

display elements disposed in the display area;

a thin-film encapsulation layer disposed on the display elements and including:

a first inorganic encapsulation layer; and a second inorganic encapsulation layer; and an organic encapsulation layer disposed between the first inorganic encapsulation layer and the second inorganic encapsulation layer;

a dam disposed in the non-display area and surrounding the display area; and a power supply line disposed on the inorganic insulating layer in the non-display area, wherein a portion of the power supply line intersects the dam, an edge of the portion of the power supply line is covered by at least one transparent conductive material layer, and the first inorganic encapsulation layer extends to the non-display area, and a portion of the first inorganic encapsulation layer is disposed on the portion of the power supply line covered by the at least one transparent conductive material layer.

19. The electronic apparatus of claim 18, wherein the edge of the portion of the power supply line is covered by the at least one transparent conductive material layer, between the dam and an edge of a substrate.

20. The electronic apparatus of claim 18, wherein the display apparatus includes:

first display elements disposed in the first display area;

second display elements disposed in the second display area;

second sub-pixel circuits respectively electrically connected to the second display elements; and connection lines respectively electrically connecting the second display elements to the second sub-pixel circuits, and the second sub-pixel circuits are disposed between the first display area and the second display area, or in the non-display area.

21. The electronic apparatus of claim 20, wherein the connection lines include a first connection line, a second connection line, and a third connection line respectively disposed on different layers, and the at least one transparent conductive material layer includes:

a first transparent conductive material layer;

a second transparent conductive material layer; and a third transparent conductive material layer, the second transparent conductive material layer disposed on the first transparent conductive material layer, and the third transparent conductive material layer disposed on the second transparent conductive material layer.

22. The electronic apparatus of claim 21, wherein the first connection line and the first transparent conductive material layer include a same material, the second connection line and the second transparent conductive material layer include a same material, and the third connection line and the third transparent conductive material layer include a same material.

23. The electronic apparatus of claim 18, wherein the edge of the portion of the power supply line has a substantially straight line shape in plan view.

* * * * *